United States Patent
Murakami et al.

(10) Patent No.: US 7,303,455 B2
(45) Date of Patent: *Dec. 4, 2007

(54) METHOD OF FABRICATING A LIGHT EMITTING DEVICE INCLUDING A STEP FOR CLEANING THE SURFACE OF AN ANODE LAYER DURING MANUFACTURE

(75) Inventors: Satoshi Murakami, Tochigi (JP); Ritsuko Nagao, Kanagawa (JP); Masayuki Sakakura, Kanagawa (JP); Misako Nakazawa, Tochigi (JP); Noriko Miyagi, Kanagawa (JP); Hisao Ikeda, Kanagawa (JP); Kaoru Tsuchiya, Kanagawa (JP); Ayumi Ishigaki, Kanagawa (JP); Masahiro Takahashi, Kanagawa (JP); Noriyuki Matsuda, Kanagawa (JP); Hiroki Ohara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/406,775

(22) Filed: Apr. 19, 2006

(65) Prior Publication Data

US 2006/0211325 A1    Sep. 21, 2006

Related U.S. Application Data

(63) Continuation of application No. 10/621,989, filed on Jul. 17, 2003, now Pat. No. 7,037,157.

(30) Foreign Application Priority Data

Jul. 25, 2002    (JP)    ............................ 2002-217248

(51) Int. Cl.
*H01L 51/56* (2006.01)
*H01L 51/50* (2006.01)
*H05B 33/10* (2006.01)

(52) U.S. Cl. ............................ 445/24; 445/26; 445/59; 438/99; 438/155

(58) Field of Classification Search ................. 445/24, 445/25; 438/155, 99
See application file for complete search history.

(56) References Cited

U.S. PATENT DOCUMENTS 4,891,334 A    1/1990    Satoh et al. ................. 437/228

(Continued)

FOREIGN PATENT DOCUMENTS

EP    0 917 410 A1    5/1999

(Continued)

OTHER PUBLICATIONS

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

(Continued)

*Primary Examiner*—Mariceli Santiago
(74) *Attorney, Agent, or Firm*—Cook, Alex, McFarron, Manzo, Cummings & Mehler, Ltd.

(57) ABSTRACT

A light emitting element has been fabricated by making a barrier having a curved surface having a radius of curvature at the upper portion or lower portion, washing a surface of an anode with a porous sponge in order to remove minute grains dotted on the surface of the anode, and performing the vacuum heating in order to remove absorbed water of a whole of a substrate on which a TFT and the barrier have been provided immediately before a layer containing an organic compound is formed.

18 Claims, 15 Drawing Sheets

U.S. PATENT DOCUMENTS

| | | | |
|---|---|---|---|
| 5,447,824 A | 9/1995 | Mutsaers et al. | 430/315 |
| 5,550,066 A | 8/1996 | Tang et al. | 437/40 |
| 5,669,979 A | 9/1997 | Elliott et al. | 134/1 |
| 5,853,905 A | 12/1998 | So et al. | 428/690 |
| 5,929,561 A | 7/1999 | Kawami et al. | 313/506 |
| 6,060,826 A | 5/2000 | Ueda et al. | |
| 6,099,746 A | 8/2000 | Kim | |
| 6,120,584 A | 9/2000 | Sakata et al. | 96/135 |
| 6,150,668 A | 11/2000 | Bao et al. | 257/40 |
| 6,187,684 B1 | 2/2001 | Farber et al. | 438/704 |
| 6,194,837 B1 | 2/2001 | Ozawa | 315/169.1 |
| 6,218,206 B1 | 4/2001 | Inoue et al. | 438/30 |
| 6,246,179 B1 | 6/2001 | Yamada | 315/169.2 |
| 6,308,369 B1 | 10/2001 | Garcia et al. | 15/230 |
| 6,720,198 B2 | 4/2004 | Yamagata et al. | 438/29 |
| 6,815,723 B2 | 11/2004 | Yamazaki et al. | 257/88 |
| 6,995,511 B2 | 2/2006 | Yamazaki et al. | |
| 7,037,157 B2 * | 5/2006 | Murakami et al. | 445/24 |
| 2001/0041270 A1 | 11/2001 | Maruyama et al. | 428/690 |
| 2001/0049197 A1 | 12/2001 | Yamazaki et al. | |
| 2002/0018153 A1 | 2/2002 | Kitabayashi | 349/40 |
| 2002/0024493 A1 | 2/2002 | Ozawa et al. | 345/92 |
| 2002/0066902 A1 | 6/2002 | Takatoku | 257/72 |
| 2002/0071995 A1 | 6/2002 | Montgomery et al. | 430/5 |
| 2002/0085143 A1 | 7/2002 | Kim et al. | |
| 2002/0110940 A1 | 8/2002 | Yamagata et al. | 438/22 |
| 2002/0113248 A1 | 8/2002 | Yamagata et al. | 257/187 |
| 2002/0132383 A1 | 9/2002 | Hiroki et al. | 438/17 |
| 2002/0153831 A1 | 10/2002 | Sakakura et al. | 313/504 |
| 2003/0015961 A1 * | 1/2003 | Yamazaki | 313/504 |
| 2003/0162314 A1 | 8/2003 | Yamazaki et al. | 438/46 |
| 2003/0194484 A1 | 10/2003 | Yamazaki et al. | |
| 2005/0181551 A1 | 8/2005 | Yamazaki et al. | |
| 2007/0004157 A1 | 1/2007 | Yamazaki et al. | |

FOREIGN PATENT DOCUMENTS

| | | |
|---|---|---|
| EP | 0 962 984 A2 | 12/1999 |
| EP | 0 993 235 A2 | 4/2000 |
| EP | 1 006 587 A2 | 6/2000 |
| EP | 1 369 499 A2 | 12/2003 |
| JP | 09-245965 | 9/1997 |
| JP | 11-224781 | 8/1999 |
| JP | 11-271753 | 10/1999 |
| JP | 2001-033745 | 2/2001 |
| JP | 2001-118440 | 4/2001 |
| WO | WO 99/48338 | 9/1999 |

OTHER PUBLICATIONS

O'Brien, D.F. et al, "Improved Energy Transfer in Electrophosphorescent Devices," Applied Physics Letters, vol. 74, No. 3, pp. 442-444, Jan. 18, 1999.

Miyashita, S. et al, "Full Color Displays Fabricated by Ink-Jet Printing," Asia Display/IDW '01, pp. 1399-1402 (2001).

European Search Report re application No. EP 03016987.4, dated Apr. 20, 2007.

Intellectual Property Office of Singapore, Austrian Patent Office Search Report re Singapore patent application No. 200304167-0, dated Feb. 9, 2007.

* cited by examiner

FORMATION OF ANODE AND GENTLE SLOPING BARRIER

SPONGE WASHING OF SURFACE OF ANODE

VACUUM HEATING IMMEDIATELY BEFORE LAYER CONTAINING ORGANIC COMPOUND IS FORMED

FORMATION OF LAYER CONTAINING ORGANIC COMPOUND, AND CATHODE

CHANGE OF AMOUNT OF SHRINK WITH TIME PASSING UNDER 65°C AND % RH

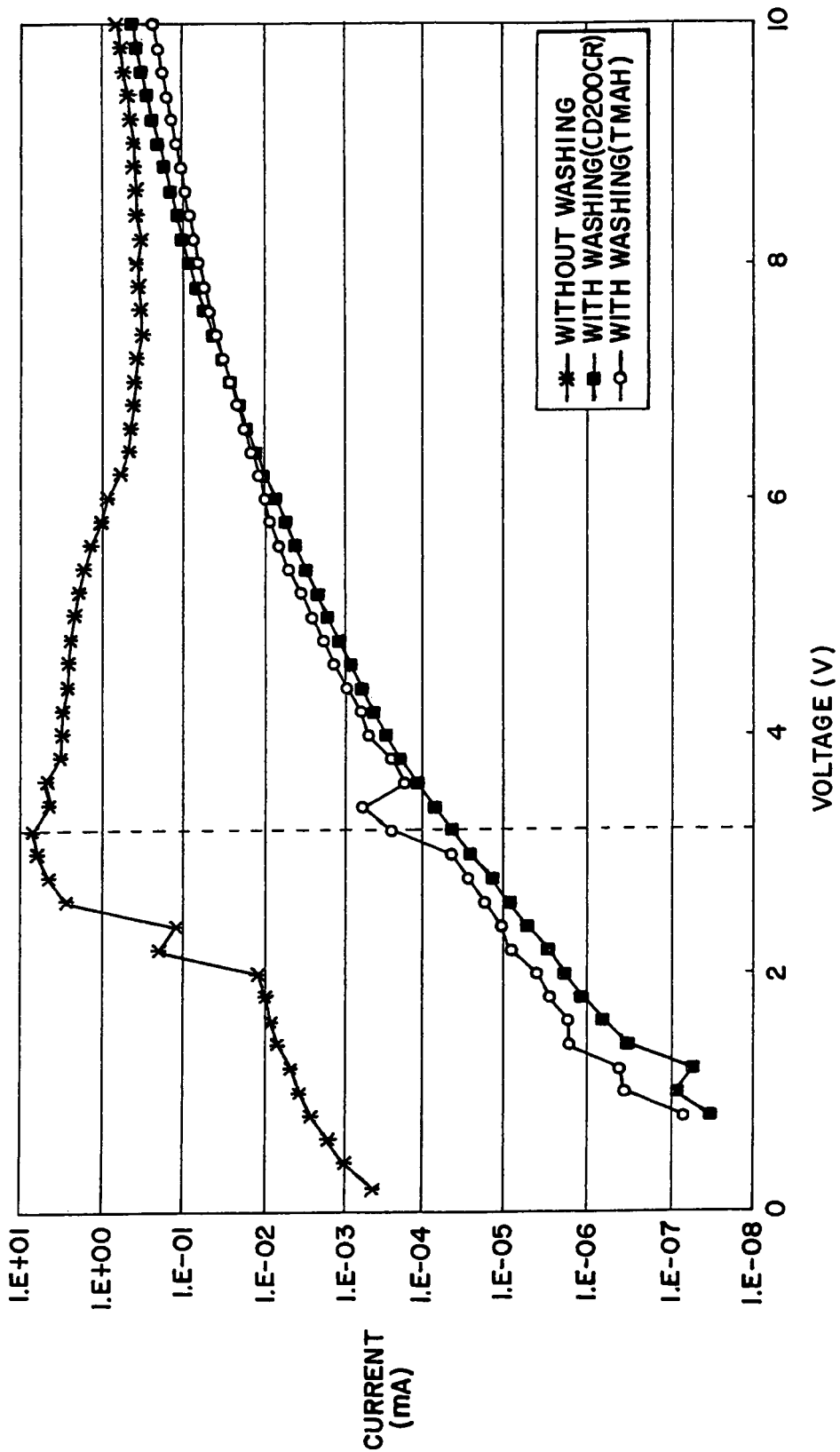

SPONGE WASHING OF SURFACE OF ANODE

FORMATION OF FIRST LAYER CONTAINING ORGANIC COMPOUND (COATING METHOD)

VACUUM HEATING IMMEDIATELY BEFORE SECOND LAYER CONTAINING ORGANIC COMPOUND IS FORMED

FORMATION OF SECOND LAYER CONTAINING ORGANIC COMPOUND, AND CATHODE (VAPOR DEPOSITION METHOD)

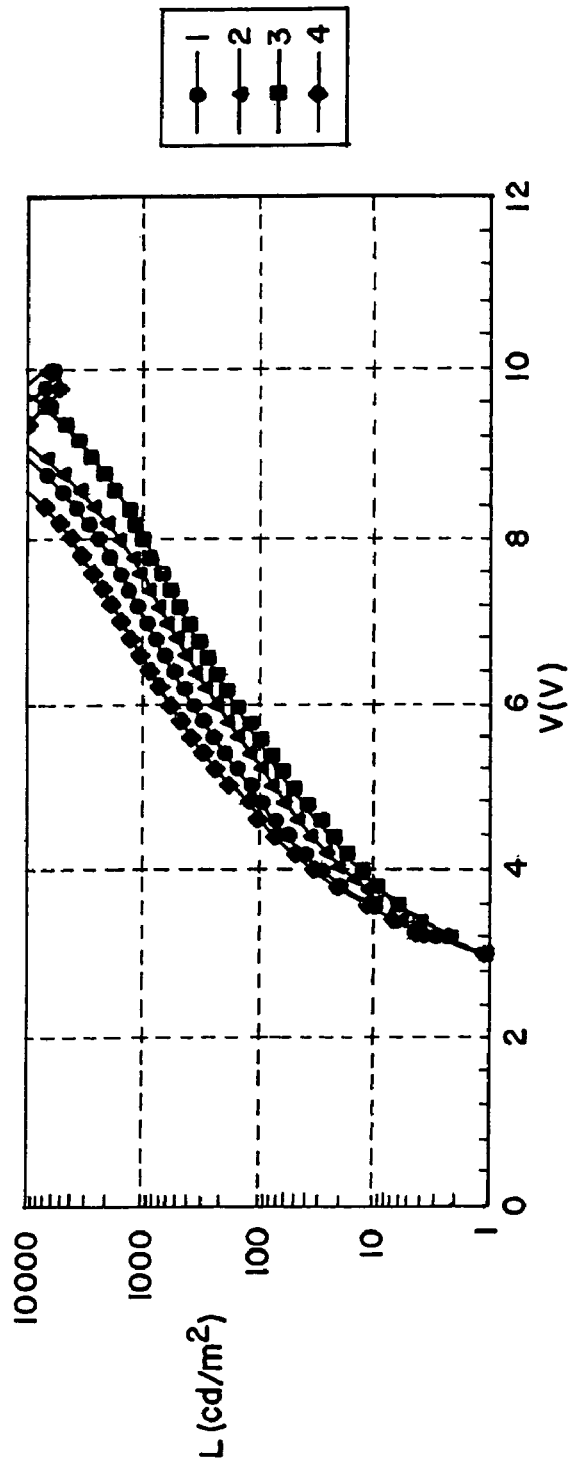

METHOD OF FABRICATING A LIGHT EMITTING DEVICE INCLUDING A STEP FOR CLEANING THE SURFACE OF AN ANODE LAYER DURING MANUFACTURE

This application is a continuation of application Ser. No. 10/621,989 filed on Jul. 17, 2003 now U.S. Pat. No. 7,037,157.

BACKGROUND OF THE INVENTION

1. Field of the Invention

The present invention relates to a semiconductor device including a circuit consisting of thin film transistors (hereinafter referred to as "TFT") and a manufacturing method thereof. Further, the present invention, for example, relates to a light emitting device using a light emitting element emitting fluorescence or phosphorescence by applying an electric field to an element having a film including an organic compound (hereinafter referred to as "organic compound layer") between a pair of electrodes, and to a manufacturing method thereof. Note that a light emitting device in this specification includes an image display device, a luminescent device and a light source (including illuminating devices). Further, a light emitting device includes all of a module of a light emitting device attached with a connector, for example, a FPC (flexible printed circuit) or TAB (tape automated bonding) tape or TCP (tape carrier package), a module provided with a printed wiring board at a front end of the TAB tape or the TCP and a module in which a light emitting element is directly mounted with ICs (integrated circuit) by COG (chip on glass) system.

Note that a semiconductor device in this specification indicates general apparatuses that are capable of functioning by utilizing semiconductor characteristics and includes an electro-optical display device, a light emitting device, a semiconductor circuit and electronic equipment.

2. Description of the Related Art

There is expected application of a light emitting element using an organic compound characterized in thin shape, light weight, high response and direct current low voltage drive as a light emitting body to a flat panel display of next generation. Particularly, a display device arranged with light emitting elements as a matrix shape seems to be superior to a liquid crystal display device of a related art in view of wide viewing angle and excellence in optical recognizing performance.

According to the light emitting mechanism of a light emitting element, it is said that by interposing an organic compound layer between a pair of electrodes and applying voltage, an electron injected from a cathode and a hole injected from an anode are recombined at a center of light emission in the organic compound layer to form molecular exciton and when the molecular exciton returns to the ground state, energy is discharged to emit light. There are known singlet excitation and triplet excitation in excited state and it seems that light can be emitted by way of either of the excited states.

It is possible to use driving methods of passive matrix drive (simple matrix type) and active matrix drive (active matrix type) for such a light emitting device formed by arranging light emitting elements in a matrix shape. However, when a pixel density is increased, the active matrix type light emitting device provided with switches for each pixel (or dot) is advantageous since the active matrix type light emitting device can be driven at low voltage.

Further, although a low molecular system and high molecular system (polymer system) material have been respectively researched for the organic compound for constituting the organic compound layer (strictly speaking, light emitting layer) regarded to be the core of a light emitting element, more attention is given to the high molecular system material facilitated to handle and having high heat resistance than the low molecular system material.

Further, although there are known methods such as vapor deposition method, spin coating method and ink jet method for a film formation method of the organic compounds, as a method for realizing full color formation by using the high molecular system material, the spin coating method and the ink jet method are particularly well known.

The light emitting elements having the organic compound has a defect that is easy to be deteriorated by various factors, therefore it is a maximum object of the light emitting elements to be formed with high reliability (long lifetime).

A light emitting element having an organic compound is easily deteriorated mainly due to water and oxygen, and as a failure state caused by these causing factors, a state in which the lowering of brightness has partially occurred or a non-light emitting region has been generated is seen.

Moreover, a state in which the expansion of the non-light emitting region progresses is also seen as the changes occurring only along with the passing time, or as the changes occurring when the time passes while the light emitting element is driven. Particularly, in the case where a non-light emitting region is generated at the stage immediately after a light emitting element having an organic compound has been fabricated, the expansion of the non-light emitting region often progresses along with the time passing, and it may be also seen that it progresses further until finally the entire region deteriorates to be the non-light emitting region.

Moreover, the non-light emitting region is easier generated from the circumferential portion of the light emitting region, and since the expansion of the non-light emitting region progresses along with the time passing as if the light emitting region shrinks, this failure mode is referred to as a shrink. It should be noted that in FIG. 11A, a light emitting state immediately after the light emitting element has been fabricated is shown, and that in FIG. 11B, how the shrink was generated when the time further passed immediately after the light emitting element had been fabricated is shown. FIG. 11B shows an example in which the expansion of the non-light emitting region is uniformly generated after the non-light emitting region has been generated from the circumferential portion, however, it may occur that the circumferential portion of the light emitting region is in convex and concave shapes by the ununiformly progressing shrink.

Because the light emitting area reduces, particularly in such a case where the area of the light emitting region is as small as that of an active matrix type light emitting device, these failures mean that a certain light emitting element becomes a non-light emitting element at an early timing. And further, in the case where the area of the light emitting region is small, if the light emitting area is reduced, the ratio occupied by the non-light emitting region is enlarged. Therefore, in the case where a display device is fabricated using a light emitting element, it is difficult to obtain a highly-defined (whose pixel pitch is small) and highly reliable display.

Moreover, a non-light emitting region just like the sunspot may be generated immediately after a light emitting element having an organic compound has been fabricated, this failure mode is referred to as a dark spot. Moreover, this dark spot may be also expanded along with the time passing. It should be noted that FIG. 12A is a figure showing that a dark spot exists at the third one from the top of the left row, at the first one and sixth one from the top of the right row immediately after the light emitting element has been fabricated, and how the expansion of the dark spot is generated when the time passed from the time immediately after the light emitting element has been fabricated is shown in FIG. 12B. In FIG. 12B, a shrink is also generated at the same time with the expansion of the dark spot.

An object of the present invention is to reduce or eliminate the occurrence of the above-described various failure modes in a light emitting element having an organic compound.

SUMMARY OF THE INVENTION

The present inventors have found that a non-light emitting region being generated immediately after the light emitting element having an organic compound has been fabricated are mainly attributed to the crack of an anode, and the shape of barrier (which is also referred to as bank or embankment) disposed between the respective anodes.

Then, it is preferable that in the present invention, a surface which is in contact with the lower surface of an anode is made flat in order to prevent it from cracking an anode, for example, in the case where an anode is formed on an inter layer dielectric such as an organic resin film, the crack of the anode can be prevented by providing a silicon nitride film between an organic resin film and an anode using a RF sputtering method and making the coverage better. It should be noted that a HMDS (hexamethyl disilazane) treatment might be performed in order to enhance the adherence between an organic resin film and a silicon nitride film. Moreover, if it is made in a constitution in which only an inorganic insulating film (silicon oxide film provided by a PCVD (Plasma Chemical Vapor Deposition) method) being in contact with the lower surface of an anode is provided as an inter layer dielectric, a non-light emitting region generated immediately after the light emitting element has been fabricated can be nullified.

Moreover, in the present invention, a non-light emitting region generated immediately after the light emitting element has been fabricated can be eliminated by adding the procedure in which the coverage of a cathode is made excellent by making the shape of a barrier (which is also referred to as a bank or embankment) disposed between the respective anodes into a shape of the roughness of the surface being less and a tapered shape that is gently sloped, and desirably, the shape having a curved surface having a radius of curvature at the upper end or lower end (its example is shown in FIG. 2B or FIG. 3).

Moreover, the present inventors have found that a dark spot generated immediately after the light emitting element having an organic compound has been fabricated can be mainly attributed to minute grains dotted on the surface of an anode.

In FIG. 13, a sectional photograph of TEM (Transmission Electron Microscope) is shown. In FIG. 13, it can be observed that minute grains having a size of less or equal to 0.1 μm in a spherical shape exist on the ITO (Indium Oxide-Tin Oxide alloy). It should be noted that FIG. 13 is a sectional diagram showing the state after a light emitting element has been emitted, that is, after the light emitting element has been energized. Moreover, when an EDX (Energy Dispersive X-ray Fluorescence Spectrometer) measurement (FIG. 14, FIG. 15 and FIG. 16) was carried out at three points on the section of FIG. 13, it was found that the component of the minute grain was approximately the same with ITO (Indium Oxide-Tin Oxide alloy) component. These minute grains seem to be a dust in the ITO (Indium Oxide-Tin Oxide alloy) film fabricated by a sputtering method, a dust in the wet etching step of a barrier, or a dust in the patterning step of the ITO (Indium Oxide-Tin Oxide alloy) film. Moreover, there may be also a case where the current is locally concentrated by the minute grains and then, the bright spot (location whose brightness is higher than those of the surroundings) is generated.

Then, in the present invention, in order to remove the minute grains dotted on the surface of an anode, a surfactant (weak alkali) is contained in a porous sponge (representatively, made of PVA (polyvinyl alcohol) or nylon) and the surface of the anode is rubbed and washed. Furthermore, in the case where the washing has not been carried out, there have been problems such as the minute grain causing a local short circuit between the anode and cathode and the whole of one pixel becoming non-light emitting (point defect), or the electrical characteristics of the fabricated light emitting element observed to be abnormal. It should be noted that as for the electrical characteristics of a light emitting element fabricated without washing, the brightness with respect to the voltage is hardly changed, whereas the abnormality that the light emitting efficiency is extremely lowered in the drive at a low voltage (3V to 5V) is observed. In order to solve these problems too, it is effective that a surfactant is contained in a porous sponge and the surface of the anode is rubbed and washed. In FIG. 5, the electrical characteristics of a light emitting element to which washing was not carried out, and the electrical characteristics of a light emitting element to which washing (with TMAH (tetramethyl ammonium hydroxide), CD200CR) was carried out, are shown. Moreover, the washing using the sponge may be carried out a plurality of times prior to the formation of the barrier or after the formation of the barrier, or prior to and after the formation of the barrier. Moreover, as a washing mechanism, a washing apparatus having a rolling brush (made by PVA) which comes in contact with the surface of the substrate while it rotates around the axis line which is in parallel to the surface of the substrate may be used, or a washing apparatus having a disc brush (made by PVA (polyvinyl alcohol)) which comes in contact with the surface of the substrate while it rotates around the axis line which is vertical to the surface of the substrate may be also used.

Moreover, the present inventors have found that a shrink that the non-light emitting region is expanded is mainly attributed to the phenomenon that a minute amount of water including absorbed water reaches to a layer containing an organic compound.

Then, in the present invention, it is desirable that the water existing within the active matrix substrate (including absorbed water) is removed immediately before the layer containing an organic compound is formed on an active matrix substrate having a TFT (Thin Film Transistor), so, by performing the vacuum heating at 100° C. to 250° C. prior to the formation of the layer containing an organic compound, the prevention of occurrence or reduction of a shrink can be done. Particularly, in the case where an organic resin film is used as a material of an inter layer dielectric and a barrier, since water is easily absorbed depending upon an organic resin material, and further, since there may be a fear that degassing may occur, it is effective to perform the vacuum heating at 100° C. to 250° C. prior to the formation of the layer containing an organic compound.

In addition, it is preferable that the active matrix substrate is heated under atmospheric pressure in an inert atmosphere before the vacuum heating is performed. By heating under an atmospheric pressure in an inert atmosphere in advance, the time required for the vacuum heating can be reduced. Further, it is preferable that organic materials (dust) existing over the substrate surface is removed and the work function is improved by conducting a UV processing which irradiates ultraviolet rays. The rise of the work function affected by the UV processing weakens as time go on. Therefore, after the UV processing is conducted, the substrate may be instantly transferred in a vacuum chamber to conduct vacuum baking.

Furthermore, in the present invention, in order to prevent water from invading into the layer containing an organic compound, it is preferable that the steps including the step of forming the layer containing an organic compound up to the step of sealing are carried out without contacting the atmospheric air.

Moreover, in the case where the barrier is formed with an organic resin film, the prevention of occurrence or reduction of a shrink can be carried out by covering it with a silicon nitride film by means of a RF sputtering method. It should be noted that in order to enhance the adhesiveness between the barrier composed of an organic resin film and the silicon nitride film, a HMDS treatment may be carried out.

Furthermore, the invasion of water into the layer containing an organic compound may be prevented by thickening the cathode film to be greater than or equal to 400 nm.

The constitution of the present invention disclosed in the present specification comprises, a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an anode, forming an insulating matter for covering the end portions of the foregoing anode, washing the surface of the foregoing anode with a porous sponge, performing the vacuum heating immediately before the layer containing an organic compound is formed, forming a layer containing an organic compound, and forming a cathode.

It may be washed prior to the formation of the insulating matter which is to be a barrier, and the constitution of another invention comprises a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an anode, washing the surface of the foregoing anode with a porous sponge, forming an insulating matter for covering the end portions of the foregoing anode, performing the vacuum heating immediately before the layer containing an organic compound, forming a layer containing an organic compound, and forming a cathode.

Moreover, it may be washed prior to and after the formation of the insulating matter which is to be a barrier, and the constitution of still another invention comprises, a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an anode, washing the surface of the foregoing anode with a porous sponge, forming an insulating matter for covering the end portions of the foregoing anode, washing the surface of the foregoing anode with a porous sponge, performing the vacuum heating immediately before the layer containing an organic compound is formed, forming a layer containing an organic compound, and forming a cathode.

Moreover, it is preferable that an insulating film being in contact with the lower surface of an anode is made an inorganic insulating film, and the constitution of still another invention comprises, a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an organic insulating film for covering a TFT (Thin Film Transistor), forming a silicon nitride film or a silicon oxide film on an organic insulating film by a sputtering method, forming an anode which is electrically connected to the foregoing TFT on the relevant silicon nitride film, forming an insulating matter for covering the end portions of the foregoing anode, washing the surface of the foregoing anode with a porous sponge, performing the vacuum heating immediately before the layer containing an organic compound is formed, forming a layer containing an organic compound, and forming a cathode.

In the respective constitutions described above, it is characterized in that the temperature of the foregoing vacuum heating is in the range from 100° C. to 250° C., absorbed water of the substrate is removed and the occurrence of a shrink is suppressed.

In the respective constitutions described above, it is preferable that the step of performing the foregoing vacuum heating, the step of forming the foregoing layer containing an organic compound, and the step of forming the foregoing cathode are in turn and continuously performed without being in contact with the atmospheric air, and it is more preferable that the invasion of water and oxygen is suppressed by continuously performing the steps up to the step of sealing without being in contact with the atmospheric air, and the reliability of it is enhanced.

Moreover, after a layer containing a first organic compound composed of a high-molecular weight material, which is in contact with the anode washed with a sponge, was formed into a film by a coating method, the number of the point defects can be reduced by performing the vacuum heating at 100° C. to 200° C. immediately before a layer containing a second organic compound composed of a low-molecular weight material is formed, and by forming the layer containing the second organic compound into a film by means of a vapor deposition method. Furthermore, the occurrence of a non-light emitting region generated immediately after the element has been fabricated can be also eliminated.

A layer containing an organic compound may be laminated and formed with different methods of forming into a film, and the constitution of still another invention comprises, a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an anode, forming an insulating matter for covering the end portions of the foregoing anode, washing the surface of the foregoing anode with a porous sponge, forming a layer containing the first organic compound being in contact with the foregoing anode by a coating method, performing the vacuum heating immediately before the layer containing the second organic compound is formed, forming a layer containing the second organic compound by a vapor deposition method, and forming a cathode.

In the constitution described above, it is characterized in that a layer containing the foregoing first organic compound is made of a high-molecular weight material, and a layer containing the second organic compound is made of a low-molecular weight material. Moreover, it is preferable that the temperature of the foregoing vacuum heating is in the range in which the layer containing the first organic compound composed of a high-molecular weight material is durable, and it is characterized in that the range is made in the range from 100° C. to 200° C.

Further, the heating treatment may be preformed under the atmospheric pressure before the vacuum heating is conducted, and the constitution of still another invention comprises, a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an anode, forming an insulating matter for covering the end portions of the foregoing anode, washing the surface of the foregoing anode with a porous sponge, heating under an inert atmosphere, performing the vacuum heating immediately before the layer containing an organic compound is formed, forming a layer containing an organic compound, and forming a cathode.

Further, the UV processing may be performed with respect to an anode surface before the vacuum heating is conducted, and the constitution of still another invention comprises, a method of fabricating a light emitting device having a light emitting element having an anode, a layer containing an organic compound which is in contact with the relevant anode, and a cathode which is in contact with the relevant layer containing an organic compound, and the foregoing method of fabricating a light emitting device, characterized in that it comprises the steps of, forming an anode, forming an insulating matter for covering the end portions of the foregoing anode, washing the surface of the foregoing anode with a porous sponge, heating under an inert atmosphere, irradiating ultraviolet rays to the foregoing anode, performing the vacuum heating immediately before the layer containing an organic compound is formed, forming a layer containing an organic compound, and forming a cathode.

In the aforementioned structures, it is characterized in that the heating temperature under an inert atmosphere is set to 100° C. to 250° C.

In the respective constitutions described above, it is characterized in that the degree of vacuum of the foregoing vacuum heating is in the range from $1 \times 10^{-3}$ Pa to $1 \times 10^{-6}$ Pa, and preferably, it is in the range from $1 \times 10^{-4}$ Pa to $1 \times 10^{-5}$ Pa.

In the respective constitutions described above, the step of forming the foregoing cathode is characterized in that it is carried out by an electric resistance heating method or a sputtering method, and it is made so as to be less damaging to a TFT.

An EL (electroluminescence) element has a structure in which an EL layer is sandwiched between a pair of electrodes, however, usually, an EL layer has a laminated structure. Representatively, a laminated structure which is referred to as hole transportation layer/light emitting layer/electron transportation layers which has been proposed by Tang et al. of Kodak Eastman Company is listed. This structure provides a very high light emitting efficiency, and at present, almost all of the light emitting devices for which the researches and developments are being progressed employ this structure.

Moreover, except for these, structures in which hole injection layer/hole transportation layer/light emitting layer/electron transportation layer are in turn laminated or hole injection layer/hole transportation layer/light emitting layer/electron transportation layer/electron injection layer are in turn laminated on the anode may be also used. A light emitting layer may be also doped with a fluorescent pigment or the like. Moreover, these layers may be formed using a low-molecular weight material, or may be formed using a high-molecular weight material, or may be formed using an inorganic material.

It should be noted that in the present specification, all of the layers provided between a cathode and an anode are generally referred to as a layer containing an organic compound (which is also referred to as an EL layer). Therefore, the above-described hole injection layer, hole transportation layer, light emitting layer, electron transportation layer and electron injection layer are all included in an EL layer.

Moreover, in the present specification, a light emitting element formed at a cathode, an EL layer and an anode is referred to as an EL element, and there are two kinds of methods, a method of forming an EL layer in a stripe pattern between two kinds of electrodes provided to orthogonally cross each other (which is referred to as simple matrix method), and a method of forming an EL layer between a pixel electrode and a counter-electrode, which are disposed in a matrix pattern and connected to a TFT (active matrix method).

BRIEF DESCRIPTION OF THE DRAWINGS

FIG. 5 is a graphical representation showing the relationship between current and voltage in a light emitting element for the purpose of comparing the present invention and the conventional one;

FIG. 7 is a graphical representation showing the relationship between brightness and voltage at the time when the vacuum heating conditions are changed;

DESCRIPTION OF THE PREFERRED EMBODIMENTS

Figure 1A:
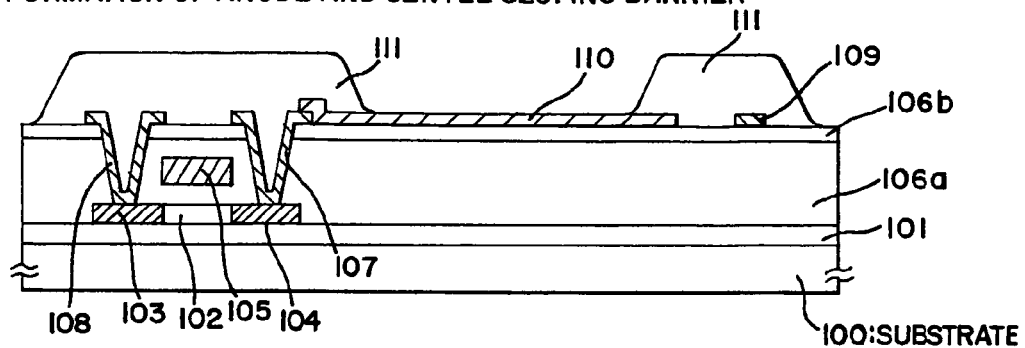
FIGS. 1A to 1D are views showing a process according to Embodiment of the present invention.

Hereinafter, Embodiments of the present invention will be described.

Now, an example is shown below, in which a layer containing an organic compound and the cathode are formed on an active matrix substrate, whose anode (ITO; Indium Oxide-Tin Oxide alloy) connected to a TFT (Thin Film Transistor) is disposed in a matrix pattern.

First, a TFT is formed on a substrate 100 having an insulating surface. An anode (pixel electrode) 110 which is connected to drain electrodes or source electrodes 108, 107 of a TFT is formed. For an anode, usually, metals whose work functions are large (Pt (Platinum), Cr (Chromium), W (Tungsten), Ni (Nickel), Zn (Zinc), Sn (Tin) and In (Indium)) are used, and in the present Example an electrically conductive film composed of ITO (Indium Oxide-Tin Oxide alloy), which is obtained by a sputtering method, is employed. A TFT (Thin Film Transistor) consists of a gate electrode 105, a channel formation region 102, source regions or drain regions 103, 104, drain electrodes or source electrodes 108, 107 and insulating films 106*a*, 106*b*. Herein, a p-channel type TFT, which is composed of a semiconductor film (representatively, polysilicon (p-Si) film) in which a channel formation region has a crystal structure, will be exemplified below.

It should be noted that the top layer of an inter layer dielectric of a TFT, that is, an insulating layer 106*b* being in contact with the anode 110 on its lower surface, is made an inorganic insulating film (representatively, a silicon nitride film fabricated by a RF sputtering method). By providing an inorganic insulating film which is excellent in coverage, cracks can be eliminated from an anode to be formed on it. Moreover, since the amount of absorbed water on the surface can be reduced by using an inorganic insulating film, the occurrence of a shrink can be suppressed, even if the film formation of a layer containing an organic compound is performed later. The silicon nitride film fabricated by a RF sputtering method is a film having high density in which silicon has been used as a target, whose etching rate using LAL500 is as slow as 0.77 nm/min to 8.6 nm/min, and hydrogen concentration in the film is measured as $1 \times 10^{21}$ atoms/cm$^3$ by a secondary ion mass spectrometry (SIMS) measurement. It should be noted that LAL500 referred to is "LAL500 SA buffered fluoric acid" made by Hashimoto Chemical and Synthetic Industries, Co., Ltd., which is an aqueous solution of $NH_4HF_2$ (7.13%) and $NH_4F$ (15.4%). Moreover, as for the silicon nitride film fabricated by the RF sputtering method, since there is hardly a difference between the shifts of C-V characteristics before and after BT stress test, the blocking of alkali metal and impurities can be carried out.

Moreover, the surface flatness can be enhanced by utilizing an organic resin film for the inter layer dielectric 106*a*. Moreover, in the case where a silicon oxide film, a silicon oxide nitride film or a silicon nitride film fabricated by a PCVD (Plasma Chemical Vapor Deposition) method or a sputtering method is used instead of the organic resin film, the occurrence of a non-light emitting region and expansion generated immediately after the fabrication of the light emitting element does not occur, and cracks of the anode can be also eliminated.

Subsequently, a barrier 111 for covering the end portions of the anode 110 is formed (FIG. 1A). The barrier 111 is formed in order to keep the insulation between the pixels which are adjacently located from each other and from the wirings by covering a contact hole of a TFT and the wiring 109. For the barrier 111, an inorganic material (silicon oxide, silicon nitride, silicon oxide nitride and the like), a photosensitive or non-photosensitive organic material (Polyimide, acryl, polyamide, polyimide, polyimide amide, resist or benzocyclobutene), or a laminated layer of these and the like can be used, however, herein, a negative type photosensitive acryl is used. A negative type organic resin which is not to be dissolved in an etchant by exposing it to the light is used, a curved surface having the first curvature radius is made at the upper end portion of the barrier and a curved surface having the second curvature radius is made at the lower end portion of the barrier. It is preferable that the foregoing first curvature radius and the foregoing second curvature radius are made in the range from 0.2 μm to 3 μm. Moreover, in the case where a positive-type organic resin which is to be dissolved in an etchant by exposing it to the light is used, the curved surface having a curvature radius can be made only at the upper end of the barrier. The non-light emitting region generated immediately after the light emitting element has been fabricated is not to be generated by making the curved surface have a radius of curvature at the upper end portion of the barrier or at the lower end portion of the barrier.

Moreover, the barrier 111 may be covered with a protective film composed of an aluminum nitride film, an aluminum nitride oxide film, or a silicon nitride film. Since absorbed water of the surface can be reduced by covering it with a protective film composed of an inorganic insulating film, even if the formation of a layer containing an organic compound is performed later, the occurrence of a shrink can be suppressed.

Figure 1B:
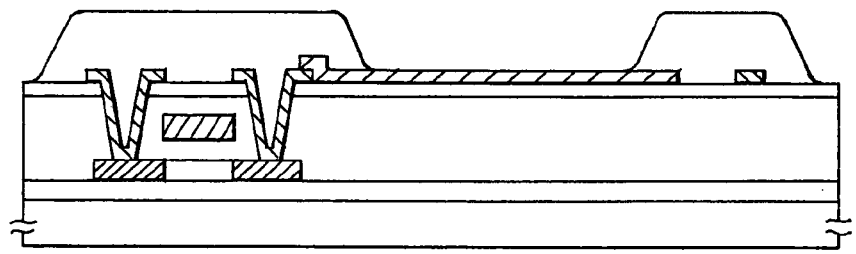
Figure 1C:
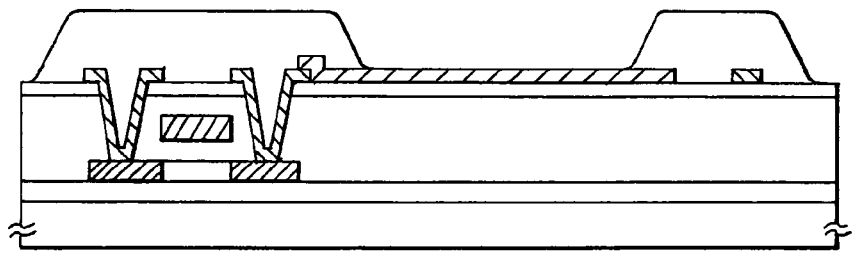

Subsequently, the surface of the anode 110 is washed (FIG. 1B). Herein, in order to remove minute grains dotted on the surface of the anode, a surfactant (weak alkali) is made contained in a porous sponge (representatively, made of PVA (polyvinyl alcohol), made of nylon), and the surface of the anode is rubbed and washed. The point defect or dark spot caused by minute grains can be reduced by rubbing and washing the surface of the anode, and further, the abnormality that the light emitting efficiency is extremely lowered in a drive at a low voltage (3V to 5V) can be also eliminated. It should be noted that although herein, an example in which the anode was washed after the formation of the barrier 111, the anode may be washed before and after the formation of the barrier 111.

Subsequently, immediately before the layer containing an organic compound is formed, the vacuum heating for the purpose of removing absorbed water of the whole substrate on which a TFT and a barrier are provided is performed (FIG. IC). Although a bake has been previously carried out at the time when the barrier is formed in order that the degassing of an organic resin film is performed, absorbed water is removed by performing the natural cooling for 30 minutes after the vacuum pumping to the pressure that is less than $5 \times 10^{-3}$ Torr (0.665 Pa), preferably, by performing the vacuum pumping to the pressure which is $10^{-4}$ Pa immediately before the layer containing an organic compound is formed, and then, after the heating was performed at 100° C. to 250° C., preferably, at 150° C.-200° C., for example, for more than or equal to 30 minutes. When the experiment was performed at separate heating temperatures (110° C., 140° C., 170° C. and 200° C.), when it was performed under the condition of heating at 170° C., the shrink could be suppressed at the maximum. Now, in the case where the vacuum heating was not sufficiently performed, since the possibility of generating a shrink that non-light emitting region expands becomes large, it is desirable that a sufficient margin is taken for heating temperature, degree of vacuum, and heating time. Particularly, if the uniformity is not good, since absorbed water partially remains, which causes the shrink, it is important to set an apparatus or conditions in which the whole of the substrate can be uniformly heated. It should be noted that since there may be a material that is not capable of resisting the heat treatment at 250° C., as for the vacuum heating, it is necessary to appropriately set it depending upon the inter layer dielectric material and wiring material.

Figure 4:
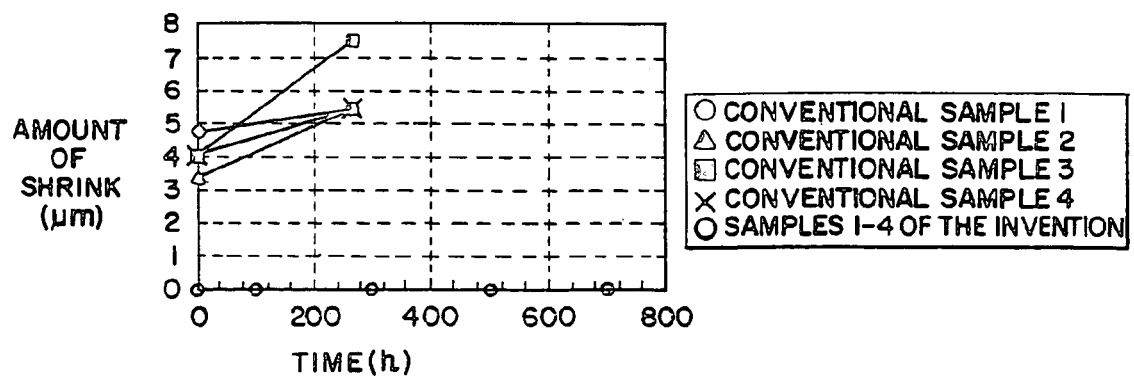
FIG. 4 is a graphical representation showing the relationship between the amount of a shrink and time for the purpose of comparing the present invention and the conventional one.

In FIG. 4, a light emitting element to which the vacuum heating has not been performed immediately before the layer containing an organic compound is vapor deposited (in the case of conventional one) and a light emitting element to which the vacuum heating has been performed at 170° C. for 30 minutes as a heating time and for 30 minutes as a natural cooling (in the case of the present invention) were compared, and the results of the amount (shrink amount) indicating how the non-light emitting region is largely expanded from the circumferential portion of the respective light emitting regions previously designed under the atmosphere of 95% of humidity at 65° C. is shown. 4 samples were prepared, respectively, and the measurements were carried out, however, as shown in FIG. 4, all of the conventional samples show that the non-light emitting region existed at the stage immediately after these have been fabricated, the fact that the amount of shrink increases along with the time passing can be read. It should be noted that although in FIG. 4, data at the time at 300 hours passed and after that time of the conventional samples were not recorded, it is because the deterioration has progressed to such an extent that none of it could be measured. On the other hand, as shown in FIG. 4, in the above-described 4 samples made according to the present invention, even when 700 hours and more have passed, the occurrence of a non-light emitting region and a shrink was found in none of these samples.

Figure 1D:
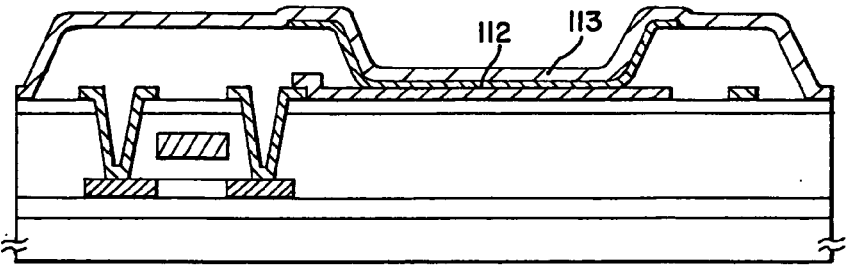

Subsequently, a layer 112 containing an organic compound is vapor deposited in the vapor deposit room in which the vacuum pumping has been carried out so as to be less than or equal to a level of $5 \times 10^{-3}$ Torr (0.665 Pa), preferably, so as to be a level of $10^{-4}$–$10^{-6}$ Pa, on which, a cathode 113 is formed by a vapor deposition method or by a sputtering method (FIG. 1D). As the layer 112 containing an organic compound, it may be made so as to be a layer composed of a high-molecular weight material, a low-molecular weight material, an inorganic material, or a layer in which these have been mixed, or a layer in which these have been dispersed, or a laminated layer in which these layers have been appropriately combined.

It should be noted that since the cathode 113 gives the damage to a TFT by X-ray which is radiated at the time when it is vapor deposited-in a vapor deposition method using an electron beam, it is preferable that it is vapor deposited using an electric resistance -heating method. As a material for the cathode 113, an alloy such as MgAg, MgIn, AlLi, $CaF_2$, CaN and the like, or a film in which an element belonging to I group or II group of the periodic table and aluminum have been formed into a film made of an alloy by a co-vapor deposition method may be employed in a film thickness ranging from 100 nm to 500 nm. The cathode made of a thicker film can better block the diffusion of water and oxygen into a layer containing an organic compound.

Through the above-described steps, a light emitting element in which there is no shrink and no dark spot and the number of the point defects has been reduced can be formed.

In addition, as desirable condition, it is preferable that the thermal processing is performed under nitrogen atmosphere (under an atmospheric pressure) at 200° C. for one hour after the substrate is cleaned with a porous sponge. Next, after ultraviolet rays are irradiated over the anode surface for 370 seconds, the vacuum heating (at 150° C., cooling for 30 minutes) is conducted for 30 minutes. According to the aforementioned processing order, the light emitting element can be efficiently formed.

Figure 2A:
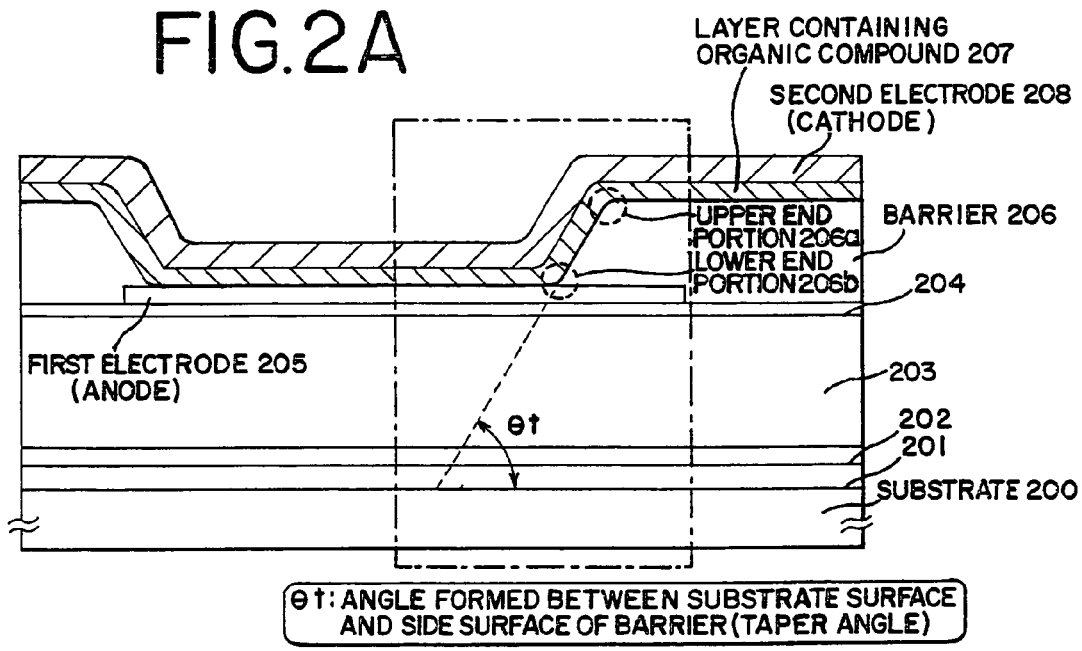
FIGS. 2A and 2B are a diagram and a TEM (Transmission Electron Microscopic) photograph showing Embodiment of the present invention.
Figure 2B:
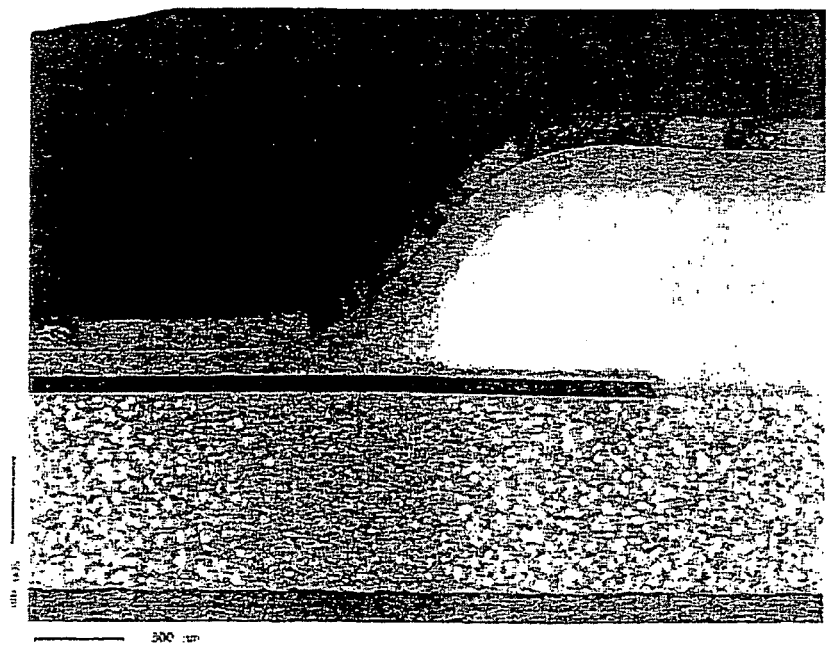

Moreover, in FIG. 2B, a photograph in which a section at the end portion of the barrier 111 in FIG. 1 was observed is shown. It should be noted that the region surrounded by chain line in FIG. 2A corresponds to FIG. 2B.

In FIG. 2A, the reference numeral 200 denotes a substrate, the reference numeral 201 denotes an under coat insulating film, the reference numeral 202 denotes a gate insulating film, the reference numeral 203 denotes an inter layer dielectric, the reference numeral 204 denotes a silicon nitride film, the reference numeral 205 denotes a first electrode (anode), the reference numeral 206 denotes a barrier, the reference numeral 207 denotes a layer containing an organic compound, and the reference numeral 208 denotes a second electrode (cathode).

In FIG. 2A, since the barrier 206 has a curved surface at the upper end portion 206a (region surrounded by the dotted line in FIG. 2A), also has a curved surface at the lower end portion 206b (region surrounded by the dotted line in FIG. 2A), and has an angle (taper angle)θt (θt=35°–70°) between the surface of the substrate and the side surface of the barrier, it is gently sloping, and the coverage of the film which is formed on it is excellent.

Figure 3:
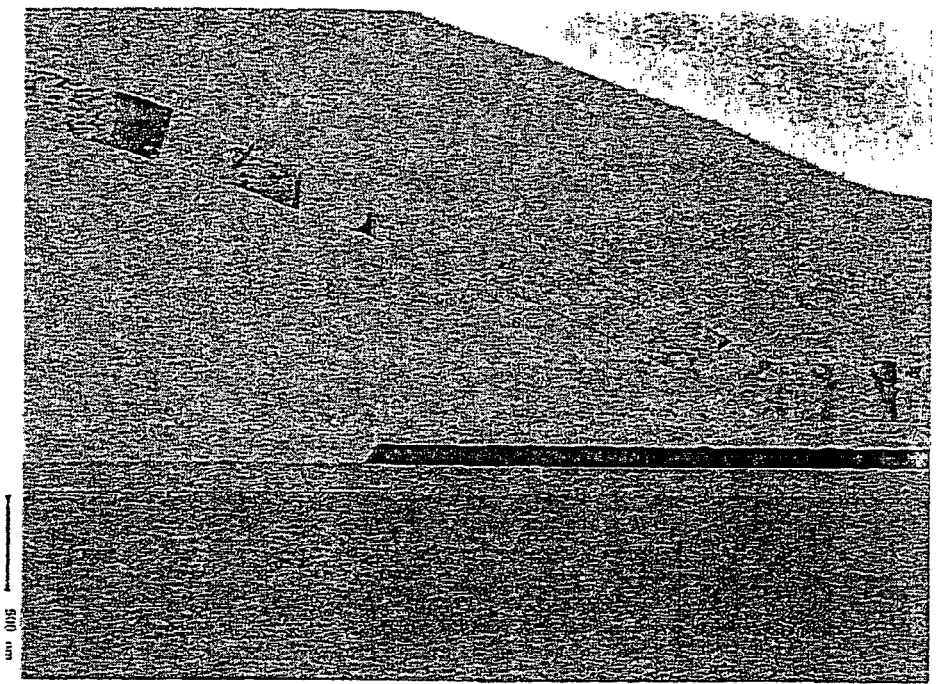
FIG. 3 is a TEM (Transmission Electron Microscopic) photograph.

Moreover, as a material for barrier, an example in the case where a positive type acryl resin was used is shown in FIG. 3. In FIG. 3, the shapes of the left and right sides are different (contrary) comparing to the configuration of FIG. 2A, however, it is a gentle sloping side surface having a curved surface only at the upper end portion.

As a shape of the barrier, either of them will do, and either of them can prevent the occurrence of a non-light emitting region generated immediately after the light emitting element has been fabricated.

Figure 6A:
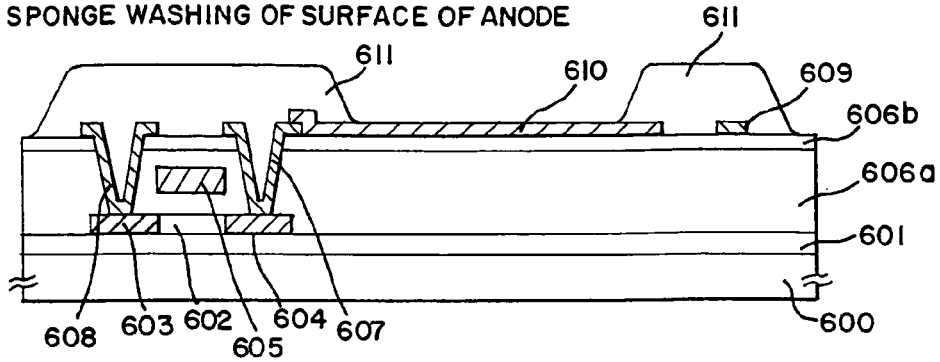
FIGS. 6A to 6D are views showing an example of steps of Embodiment of the present invention.
Figure 6B:
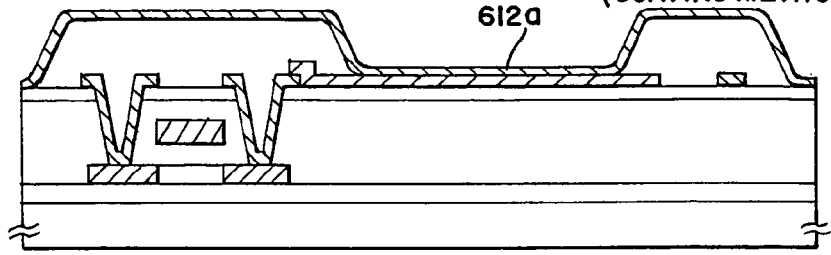
Figure 6C:
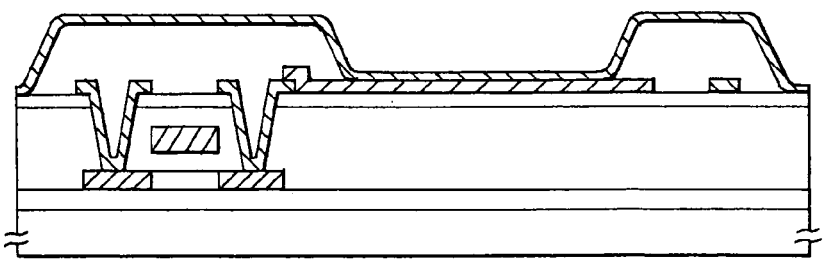
Figure 6D:
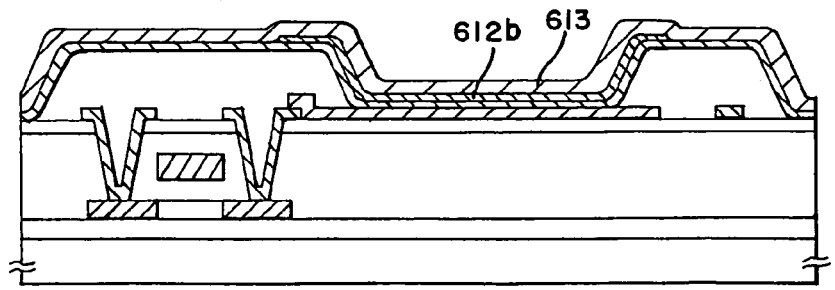

Furthermore, the coverage can be enhanced by forming a layer (first layer) containing an organic compound being in contact with the anode using a coating method. An example of a flow chart of the steps is shown in FIG. 6A-FIG. 6D as the followings: first, an anode 610 and a barrier 611 are formed similarly to FIG. 1A, and the surface of the anode is washed with a sponge similarly to FIG. 1B (FIG. 6A). Then, after a first layer 612a was baked by a coating method (FIG. 6B), and immediately after the vacuum heating (FIG. 6C) was further performed, a layer (second layer) 612b containing an organic compound and a cathode 613 are laminated by a vapor deposition method (FIG. 6D). The occurrence of the non-light emitting region generated immediately after the element has been fabricated can be eliminated by enhancing the coverage as well as the number of dark spots and point defects can be reduced by reducing the influence of minute grains by means of making the film thickness of the first layer 612a in the range from 30 nm to 80 nm, preferably, 60 nm.

It should be noted that in FIG. 6A, the reference numeral 600 denotes a substrate, the reference numeral 601 denotes an under coat insulating film, the reference numeral 602 denotes a channel formation region, the reference numerals 603, 604 denote source regions or drain regions, the reference numeral 605 denotes a gate electrode, the reference numerals 606a, 606b denote insulating films, the reference numerals 607, 608 denote source electrodes or drain electrodes, and the reference numeral 609 denotes a wiring.

The present invention comprising the above-described constitution will be described more in detail with Examples shown in the followings.

EXAMPLES

Example 1

Figure 8A:
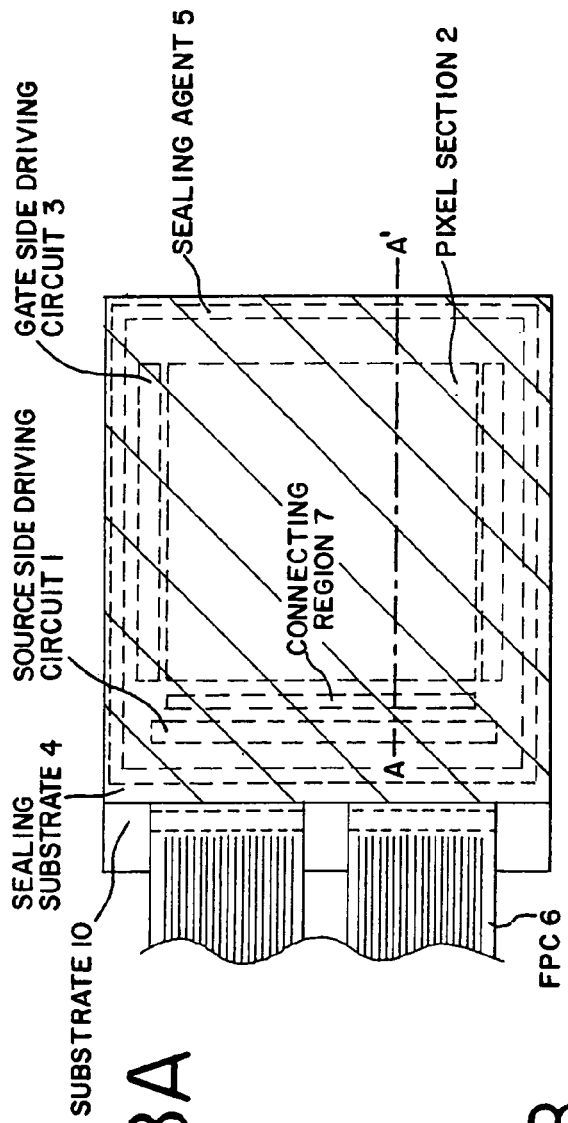
FIGS. 8A and 8B are a top view and a cross-sectional view showing Example 1.
Figure 8B:
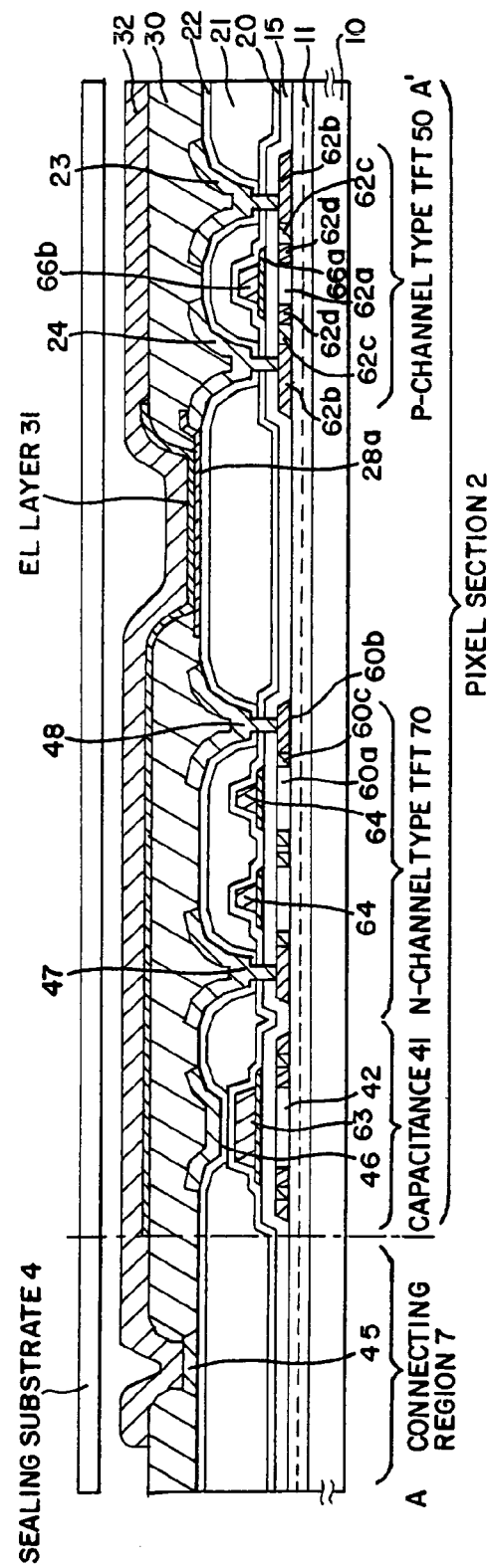

FIG. 8A is a top view of an active matrix type light emitting device, and FIG. 8B is a cross-sectional view taken on chain line A-A' or chain B-B'.

In FIG. 8, the reference numeral 1 denotes a source signal line drive circuit, the reference numeral 2 denotes a pixel section, and the reference numeral 3 denotes a gate signal line drive circuit. Moreover, the reference numeral 4 denotes a sealing substrate, the reference numeral 5 denotes a sealing agent, and the inside surrounded by the sealing agent 5 is a space in which an inert gas dried with a desiccating agent (not shown) is filled. The reference numeral 7 denotes a connecting region connecting an upper portion electrode being in common with the respective light emitting elements and the wirings located on the substrate.

It should be noted that a video signal and clock signal are received from a FPC (Flexible Print Circuit) 6 which is to be an external input terminal. Noted that although herein, only the FPC is shown, a print wiring base (PWB) might be mounted on the FPC. It is made such that a light emitting device in the present specification includes not only the main body of the light emitting device, but also the state in which the FPC or PWB is mounted on the main body of the light emitting device.

Next, the cross sectional structure will be described below with reference to FIG. 8B. A drive circuit and a pixel section have been formed on a substrate 10, however, herein, as a drive circuit, the source line drive circuit 1, the pixel section 2 and the terminal section are shown.

It should be noted that as for the source signal line drive circuit 1, a CMOS (complementary MOS) circuit in which a n-channel type TFT and a p-channel type TFT are combined is formed. A n-channel type TFT has a channel formation region which is sandwiched between the upper layer of a gate electrode and a gate insulating film 15 and in which these layers are superimposed, a low concentration impurity region which is sandwiched between the lower layer of the gate electrode and the gate insulating film 15 and in which there layer are superimposed, a low concentration impurity region which is not superimposed with the lower layer of the gate electrode, and a high concentration impurity region which is to be a source region or a drain region.

Moreover, a p-channel type TFT has a channel formation region which is sandwiched between the upper layer of the gate electrode and the gate insulating film 15 and in which these layers are superimposed, a low concentration impurity region 62d which is sandwiched between the lower layer of the gate electrode and the gate insulating film 15 and in which these layers are superimposed, a low concentration impurity region 62d which is not superimposed with the lower layer of the gate electrode and a high concentration impurity region which is to be a source region or a drain region. Moreover, a TFT which forms a drive circuit may be formed by a known CMOS circuit, a PMOS (p type MOS) circuit or a NMOS (n type MOS) circuit. Moreover, although in the present Example, a driver-integrated type in which a drive circuit has been formed on the substrate is shown, it is not necessary to be such a type, but it can be formed not on the substrate but externally.

Moreover, the pixel section 2 is formed with a TFT for switching 70, and a plurality of pixels including a first electrode (anode) 28a which is to be a lower portion electrode electrically connected to a TFT for controlling the current 50 which is connected to the first electrode 28a and its drain region or source region (high concentration impurity region) 62b. A plurality of TFTs are formed at one pixel. The TFT for controlling the current has a channel formation region 62a which is sandwiched between the upper layer of the gate electrode 66b and the gate insulating film 15 and in which these layers are superimposed, a low concentration impurity region 62d which is sandwiched between the lower layer 66a of the gate electrode and the gate insulating film 15 and in which these layers are superimposed, and a low concentration impurity region 62c which is not superimposed with the lower layer of the gate electrode 66a. It should be noted that the reference numerals 23, 24 denote source electrodes or drain electrodes, and the reference numeral 24 denotes a connecting electrode which connects the first electrode 28a to the high concentration impurity region 62b.

In FIG. 8B, a cross sectional view of a TFT for controlling the current 50, a TFT for switching 70 and a capacitance 41 is shown. In FIG. 2, as a TFT for switching 70, an example using a n-channel type TFT having a plurality of channel formation regions 60a which are superimposed with a gate electrode 64 while the gate insulating film 15 is sandwiched between them is shown. It should be noted that the reference numerals 47, 48 denote source wirings or drain wirings, the reference numeral 60b denotes a source region or a drain region, the reference numeral 60c denotes a low concentration impurity region which is not superimposed with a gate electrode 64, and the reference numeral 60b denotes a low concentration impurity region which is superimposed with the gate electrode 64. The capacitance 41 forms a holding capacitance with an electrode 46 and an electrode 63 by making the inter layer dielectrics 22, 20 as a dielectric, and further also forms a holding capacitance with an electrode 63 and a semiconductor film 42 by making the gate insulating film 15 as a dielectric.

Moreover, as inter layer dielectrics 20, 21 and 22, a photosensitive or non-photosensitive organic material (polyimide, acryl, polyamide, polyimideamide, resist or benzocyclobutene), an inorganic material formed by a sputtering method, a CVD (Chemical Vapor Deposition) method and a coating method (silicon oxide, silicon nitride, silicon oxide nitride and the like), or a laminated layer in which these layers are laminated can be used. In FIG. 8, an inorganic insulating film 20 which is composed of silicon nitride film and covers the gate electrode and the gate insulating film 15 is provided, and this inorganic insulating film 20 is an inorganic insulating film which has been film formed under the conditions of containing hydrogen in the film and which has been provided for the purpose of performing the hydrogenation terminating the dangling bond of the semiconductor layer by performing the heating treatment. It can hydrogenate the semiconductor layer existing in lower location regardless of the existence of the gate insulating film 15 composed of a silicon oxide film. Moreover, the inter layer dielectric 21 is selectively etched so that the upper end portion of it becomes a curved surface having a radius of curvature by a wet etching or a dry etching after the film made of a photosensitive organic material has been formed by a coating method. Moreover, in the case where an organic material is used for the inter layer dielectric 21, it is preferable that it is covered with a silicon nitride film, a silicon film oxide nitride film, an aluminum oxide nitride film or the inter layer dielectric 22 consisted of these layers laminated in order to block so that a light emitting element which is formed later is not deteriorated by water, gases and impurities diffusing from the inter layer dielectric 21. Moreover, the inter layer dielectric 22 can also block the diffusion of the impurities from the substrate 10 to the light emitting element and the diffusion of the impurities from the light emitting element to the TFT, and the like. Moreover, in the case where an organic material having the moisture absorption characteristic is used as the inter layer dielectric 21, it is necessary to bake again since it is swollen when it is exposed to the solution such as peeling off solution used in the other patterning step which is to be performed later, however, it can be made so that the inter layer dielectric 21 is not swollen by covering it with the inter layer dielectric 22.

Moreover, the present invention is not limited to the laminating order of the inter layer dielectrics shown in FIG. 8, or the order of the steps of film formation and hydrogenation, for example, the inter layer dielectric 22 in which the upper end portion has been made a curved surface having a radius of curvature may be formed after the inter layer dielectric 21 has been formed for the purpose of preventing the diffusion of the impurities on the inter layer dielectric for hydrogenation and hydrogenated, and an organic resin material has been formed into a film by a coating method and further by a wet etching method or a dry etching method. In the case where a film composed of an organic resin is dry etched, since there is a fear that the TFT characteristics are changed by a charge being generated, it is preferable that it is etched by a wet etching method, and in the case where an inter layer dielectric consisted of the laminated layer of an inorganic insulating film and an organic resin film is etched, only the organic resin film is etched, or the organic resin film is formed and wet etched after the inorganic insulating film has been dry etched.

In the case where a photosensitive organic resin material is used for the intercalation film 21, it tends to be a curved surface having a radius of curvature at the upper end portion as shown in FIG. 8, however, in the case where a non-photosensitive organic resin material or an inorganic material is used for the inter layer dielectric 22, it is a cross-sectional view of a contact hole as shown in FIG. 1.

Moreover, since the present invention is a case where it is made a type of light outgoing from the lower surface, it is desirable that a transparent material is used for the inter layer dielectrics 20-22.

Moreover, at the both ends of the first electrode (anode) 28a, insulating matters (which is also referred to as bank, barrier, embankment or the like) 30 are formed and a layer (which is also referred to as an EL layer) containing an organic compound 31 is formed on the first electrode (anode) 28a. At the time when the vapor deposition is performed, the organic compound has been previously gasified by electric resistance heating, and it flies away in the direction of the substrate by opening the shutter at the time when the vapor deposition is performed. A layer containing an organic compound 31 which is to be a light emitting layer (containing hole transportation layer, hole injection layer, electron transportation layer, and electron injection layer) is formed by the procedure that the organic compound gasified flies away in the upper direction and is vapor-deposited on the substrate passing through the opening portion provided at a metal mask. Since the layer containing an organic compound 31 is extremely thin, it is preferable that the surface of the first electrode is flat, for example, the surface flattening may be carried out by performing the treatment for polishing it chemically and mechanically (representatively, CMP technology) and the like before or after the patterning of the first electrode. In the case where the CMP (Chemical Mechanical Polishing) is performed, if the thickness of an electrode 24 or an insulating matter 30 is made less, or it is thinned while the end portion of electrode 24 is tapered, the degree of surface flatness of the first electrode can be further enhanced. Moreover, in the case where an organic resin film is used for the inter layer dielectric 21 in order to enhance the degree of the surface flatness of the first electrode (anode) 28a, it is preferable that the occurrence of cracks is prevented by providing an inorganic insulating film as the inter layer dielectric 22, and the occurrence of the non-light emitting region and the occurrence of the point defects generated immediately after the fabrication are suppressed.

Moreover, in order to enhance the degree of cleaning on the surface of the first electrode, the occurrence of dark spots and point defects are reduced by performing the washing (brush washing and sponge washing) for the purpose of cleaning the foreign matters (dust and the like) before and after the formation of the insulating matter 30.

For the first electrode (anode) 28a, a transparent electrically conductive film (ITO (Indium oxide-Tin oxide alloy)), Indium oxide-Zinc oxide alloy ($In_2O_3$—ZnO), Zinc oxide (ZnO and the like) may be employed.

Moreover, for the insulating matter 30, a photosensitive or non-photosensitive organic material (polyimide, acryl, polyamide, polyimideamide, resist or benzocyclobutene), an inorganic material (silicon oxide, silicon nitride, silicon oxide nitride or the like) formed by a CVD (Chemical Vapor Deposition) method, a sputtering method and a coating method, or a laminated layer in which these are laminated and the like can be employed. Moreover, a photosensitive organic material is used for the insulating matter 30, as for a photosensitive organic material, there are two kinds if these are largely classified, that is, a negative type photosensitive organic material which is not dissolved in an etchant due to the photosensitive light, or a positive type photosensitive organic material which is dissolved in the etchant due to the light, however, either can be appropriately used.

In the case where a negative type photosensitive organic material is used for the insulating matter 30, as shown in FIG. 2B, it tends to be a curved surface having a radius of curvature at the upper end portion, however, in the case where a positive type photosensitive organic material is used for that, it is a cross-sectional shape of the insulating matter shown in FIG. 3. Moreover, in the case where it is the insulating matter 30 composed of an organic material, the insulating matter 30 may be covered with an inorganic insulating film (silicon nitride film formed by a sputtering method, or the like).

Moreover, in the case where for the insulating matter 30 or the inter layer dielectrics 20-22 an organic material is used in order to remove gases and water in the film, it is important to perform the degassing by performing the heating treatment in the vacuum, and it is preferable that a layer containing an organic compound 31 is formed after the degassing has been performed. The occurrence of a shrink can be suppressed by performing the vacuum heating at 100° C. to 250° C. immediately before the film formation of a layer containing an organic compound 31 has been performed. It is preferable that the degassing is performed by again performing the vacuum heating after the formation of the layer containing an organic compound 31.

Moreover, in the case where for the inter layer dielectrics 20-22 an inorganic insulating film is used, the film formation may be carried out by a PCVD method or a sputtering method, however, particularly, silicon is used as a target by a RF sputtering method, a silicon nitride film formed only by nitrogen gas or the mixture gas of nitrogen gas and argon gas by applying the film forming pressure at 0.1 Pa-1.5 Pa, a high frequency power (5-20 W/cm$^2$) at 13.56 MHz, and setting the substrate temperature at room temperature to 350° C., has extremely strong in blocking effect with respect to an element belonging to I group or II group of the periodic table such as Na, Li and the others, and can effectively suppress the diffusion of these movable ion and the like. Although it is preferable that a metal film in which 0.2-1.5 wt % (preferably, 0.5-1.0 wt %) of lithium has been added to aluminum is used from the viewpoints of electric charge injection characteristic and others, in the case where a material containing lithium is used for a cathode, there is a fear that the operation of a transistor is damaged by the diffusion of lithium, however, if it is a silicon nitride film formed by a RF sputtering method, it can prevent lithium from diffusing in the TFT.

As for the layer containing an organic compound 31, in the case where it is made for a full color display, a material layer showing the light emissions of red color, green color and blue color may be selectively and appropriately film-formed, respectively, concretely by a vapor deposition method using a vapor deposition mask or by an ink jet method. In the case where the layer containing an organic compound 31 showing the light emission of green color is formed, in the present Example, after α-NPD has been film-formed in a thickness of 60 [nm], $Alq_3$ to which DMQD has been added is film-formed for a light emitting layer of green color in a thickness of 40 [nm], and $CaF_2$ is film-formed in a thickness of 1 [nm] for an electron injection layer. Moreover, in the case where the layer containing an organic compound 31 showing the light emission of blue color is formed, after α-NPD has been film-formed in a thickness of 60 [nm], BCP is film-formed in a thickness of 10 [nm] for a blocking layer using the same mask, $Alq_3$ is film-formed in a thickness of 40 [nm] for an electron transportation layer, and $CaF_2$ is film-formed in a thickness of 1 [nm] for an electron injection layer. Moreover, in the case where the layer containing an organic compound 31 showing red color is formed, after α-NPD has been film-formed in a thickness of 60 [nm], $Alq_3$ to which DCM has been added is film-formed in a thickness of 40 [nm] for a light emitting layer of red color, $Alq_3$ is film-formed in a thickness of 40 [nm] for an electron transportation layer, and $CaF_2$ is film-formed in a thickness of 1 [nm] for an electron injection layer.

Moreover, a light emitting display device capable of performing the full color display may be made by separately providing a color filter, a color conversion layer and the like for white color light emission. In the case where it is used as a display device or a lighting device by which only a simple display is performed, it may be made a single color light emission (representatively, white color light emission). For example, 1,3,4-oxadiazole derivative (PBD) having the electron transportation characteristic may be dispersed into polyvinyl carbazole (PVK) having the hole transportation characteristic. Moreover, white color light emission is obtained by dispersing 30 wt % of PBD as an electron transportation agent and a suitable amount of four kinds of pigments (TPB, coumarin 6, DCM1, and Nile red). Moreover, a white color light emission is capable of being obtained as a whole by appropriately selecting an organic compound film that emits the light of red color, an organic compound film that emits the light of green color and an organic compound film that emits the light of blue color, and then, by superimposing them and mixing the colors.

Moreover, poly (ethylenedioxythiophene)/poly (styrene sulfonic acid) aqueous solution (PEDOT/PSS), polyaniline/camphor sulfonic acid aqueous solution (PANI/CSA), PTP-DES, Et-PTPDEK, PPBA or the like which will act as a hole injection layer (anode buffer layer) may be coated and baked on the first electrode (anode) 28a. In the case where a hole injection layer composed of a high-molecular weight material formed by a coating method using a spin coat and the like was formed, the surface flatness is enhanced, the coverage and film thickness uniformity of the film formed on the hole injection layer can be made excellent. Particularly, a uniform light emission can be obtained since the film thickness of the light emitting layer becomes uniform. In this case, after the hole injection layer has been formed by a coating method, it is preferable that the vacuum heating (100 to 200° C.) is carried out prior to the formation of the film by a vapor deposition method. It should be noted that an example of a flow chart of the steps concerning this case is shown in FIG. 6. For example, after the surface of the first electrode (anode) has been washed with a sponge, the formation of a light emitting layer is performed by a vapor deposition method without being in contact with the atmospheric air by temporarily baking poly (ethylenedioxythiophene)/poly(styrene sulfonic acid) aqueous solution (PEDOT/PSS) in a thickness of 60 nm at 80° C. for 10 minutes by a spin coat method, fully baking at 200° C. for one hour, and further, performing the vacuum heating (170° C., heating for 30 minutes, cooling 30 minutes) on the entire surface of it. Particularly, in the case where convex portions and concave portions, and minute grains exist on the surface of ITO film, these influences can be reduced by making the film thickness of PEDOT/PSS slightly thicker.

Moreover, in the case where PEDOT/PSS is coated on the ITO film, since it is not so good at wettability, after the coating of PEDOT/PSS solution at first time has been carried out by a spin coat method, it is preferable that the formation of film is carried out with excellent uniformity by enhancing the wettability by means of once washing it with pure water, and again, the coating of the PEDOT/PSS solution is carried out by a spin coat method and by baking it. It should be noted that after the first coating has been carried out, the effect capable of removing minute grains is obtained as well as the surface is properly modified by once washing it with pure water.

Moreover, in the case where PEDOT/PSS was formed into a film by a spin coat method, since it is film-formed on the whole surface of it, it is preferable that minute grains and the like located on the end face, the circumferential portion, the terminal section of the substrate, the connecting region of the cathode and the wirings of the lower portion are selectively removed, and it is preferable that these are removed with $O_2$ ashing or the like.

Moreover, in FIG. 7, the relationship between brightness and voltage of four elements (Element 1; heating at 170° C. for 4 hours and half, cooling for 30 minutes, Element 2; heating at 250° C. for 30 minutes, cooling for 30 minutes, Element 3; heating at 270° C. for 30 minutes, cooling for 30 minutes, Element 4; heating at 170° C. for 30 minutes, cooling for 30 minutes) fabricated by applying the conditions of the vacuum heating after PEDOT/PSS has been formed into a film is shown. According to the experimental results shown in FIG. 7, Element 4 fabricated under the heating conditions of heating at 170° C. for 30 minutes and cooling for 30 minutes shows the most excellent brightness. Moreover, it is read from FIG. 7 that Element 1 fabricated under the heating conditions of heating at 170° C. for 4 hours and a half and Element 3 fabricated under the heating conditions of heating at 270° C. are bad comparing to other Elements experimented under other conditions, and it is considered that PEDOT/PSS has been denatured by heat. As for Elements using PEDOT/PSS, the effects of enhancement of light emission efficiency, elongation of lifetime, and reduction of electric noises and the like are obtained. Furthermore, it can be confirmed from FIG. 7 that Elements using PEDOT/PSS realize the reduction of drive voltage.

Moreover, a second electrode (cathode) 32 which is to be an upper portion electrode is formed on the layer containing an organic compound 31 by a vapor deposition method (electric resistance heating method) or a sputtering method. Owing to this, a light emitting element composed of the first electrode (anode) 28a, the layer containing an organic compound 31, and the second electrode (cathode) 32 is formed. In the case where the light emitting element is made in a mode of white color light emission, a color filter (for the purpose of simplifying, herein, it is not shown) composed of a coloring layer and BM is provided on the substrate 10.

The second electrode 32 functions as a wiring common to the all of the pixels, and has been electrically connected to the FPC (Flexible Print Circuit) 6 via the wiring. It should be noted that in FIG. 8, a connecting region 7 which connects a second electrode 32 to a wiring 45 is shown, the second electrode 32 is electrically connected to this FPC by routing the wiring 45.

Moreover, on the terminal section, a terminal electrode consisting of an electrode formed by the same step with that of the gate electrode, an electrode formed by the same step with that of the source electrode or drain electrode and the electrode formed by the same step with that of the first electrode 28a, has been pasted using an adhesive such as an electrically conductive adhesive and the like with the FPC (Flexible Print Circuit) 6. By the way, the construction of the terminal is not particularly limited and can be appropriately formed.

Moreover, the sealing substrate 4 is pasted together using a sealing agent 5 containing a filler in order to seal the light emitting element formed on the substrate 10. It should be noted that a spacer composed of a resin film in order to secure the interval between the sealing substrate 4 and the light emitting element may be provided. Then, an inert gas such as nitrogen or the like has been filled within the interior space of the sealing agent 5. It should be noted it is preferable that an epoxy resin is used as the sealing agent 5. Moreover, it is desirable that the sealing agent 5 is made of a material through which water and oxygen do not penetrate. Furthermore, a substance (desiccating agent or the like) having an effect of absorbing oxygen and water may be provided within the space.

Moreover, in the present Example, a plastic substrate composed of FRP (Fiberglass-Reinforced Plastics), PVF (poly vinyl fluoride), Mylar, polyester, acryl or the like can be employed except for a glass substrate, quarts substrate and others. Moreover, after the sealing substrate 4 has been adhered using the sealing agent 5, it is also capable of being sealed with a sealing agent so as to cover the side surface (exposure surface).

As described above, a light emitting element can be completely blocked from the external by sealing the light emitting element in the closed space, which can prevent the substances such as water and oxygen promoting the deterioration of an organic compound layer from invading into it. Therefore, a light emitting device having the high reliability, in which a shrink has not occurred, can be obtained.

Moreover, the present invention is not limited to the structure of a switching TFT of the pixel section of FIG. 8, for example, only a LDD (Lightly Doped Drain) region 60c which is not superimposed with the gate electrode via the gate insulating film may be provided between the channel formation region 60a and the drain region (or source region) 60b. Moreover, the shape of the gate electrode is not limited, either, and it may be made the gate electrode in a single layer.

In addition, although herein, a top gate type TFT has been exemplified, the present invention is capable of being applied regardless of the TFT (Thin Film Transistor) structure, for example, the present invention is capable of being applied to a bottom gate type (reverse stagger type) TFT and a forward stagger type TFT.

Moreover, in FIG. 8, a structure in which the first electrode 28a was formed after the connecting electrode 24 being in contact with a source region or a drain region has been formed is shown, however, it is not particularly limited, for example, a connecting electrode being in contact with the source region and drain region may be formed after the first electrode has been formed.

Moreover, after an inter layer dielectric for covering an electrode which is in contact with the source region or drain region has been further provided and a contact hole has been formed, a first electrode for connecting to an electrode on the inter layer dielectric may be formed.

Example 2

By implementing the present invention, various modules (such as an active matrix type liquid crystal module, an active matrix EL module and an active matrix EC module) can be completed. Namely, by implementing the present invention, all of the electronic equipments into which the various modules are incorporated are completed.

Following can be given as such electronic equipment: video cameras; digital cameras; head mounted displays (goggle type displays); car navigation systems; projectors; car stereos; personal computers; portable information terminals (mobile computers, cellular phone, electronic book, etc.) etc. Examples of these are shown in FIGS. 9A to 9E and 10A to 10C.

Figure 9A:
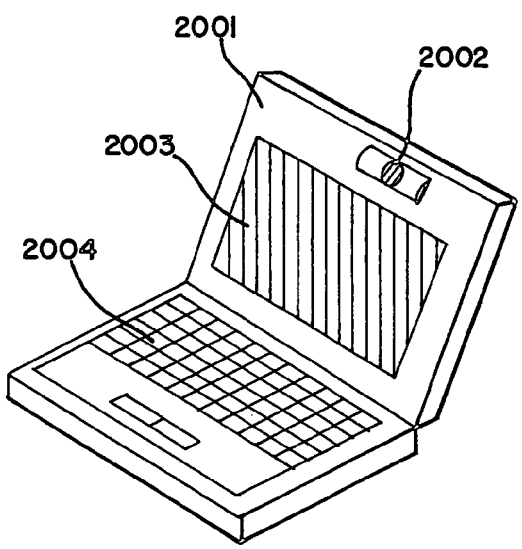
FIGS. 9A to 9E are drawings showing examples of electronic devices (Example 2)

FIG. 9A is a personal computer which comprises: a main body 2001; an image input section 2002; a display section 2003; and a keyboard 2004 etc.

Figure 9B:
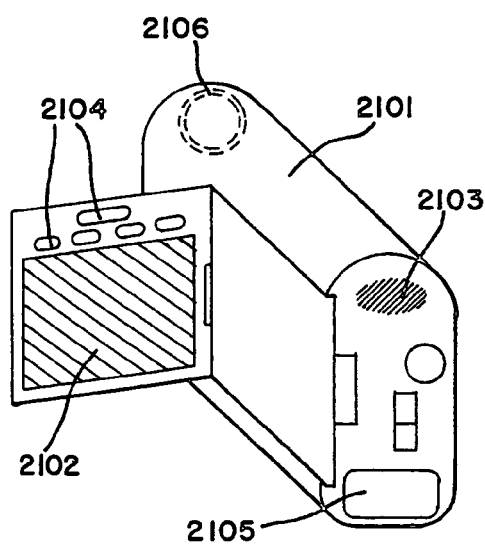

FIG. 9B is a video camera which comprises: a main body 2101; a display section 2102; a voice input section 2103; operation switches 2104; a battery 2105 and an image receiving section 2106 etc.

Figure 9C:
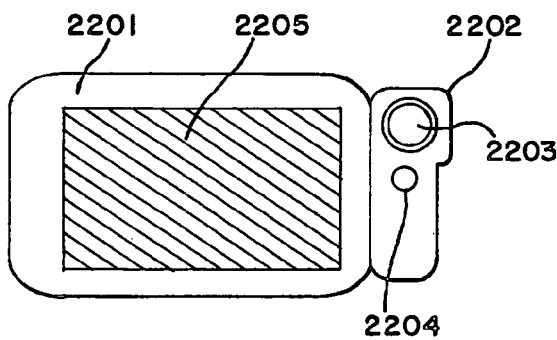

FIG. 9C is a mobile computer which comprises: a main body 2201; a camera section 2202; an image receiving section 2203; operation switches 2204 and a display section 2205 etc.

Figure 9D:
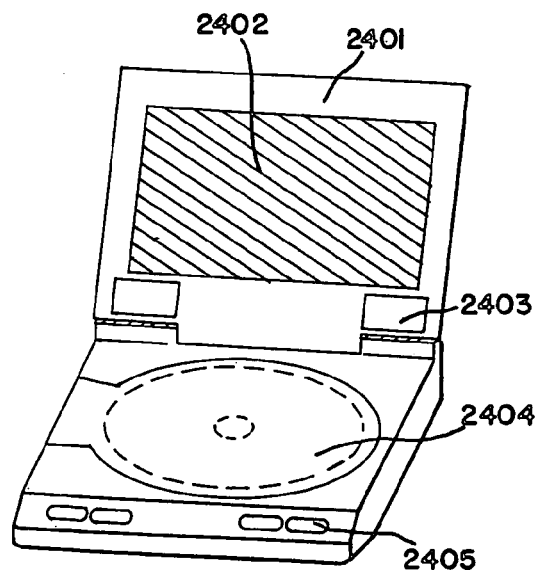

FIG. 9D is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 9E:
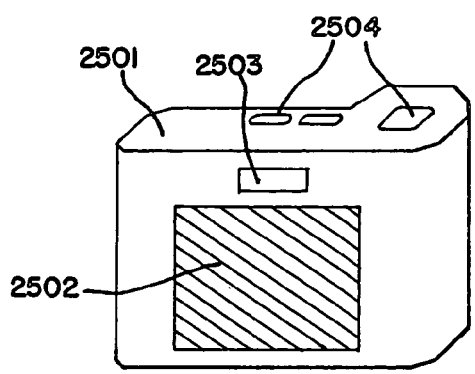

FIG. 9E is a digital camera which comprises: a main body 2501; a display section 2502; a view finder 2503; operation switches 2504; and image receiving section (not shown in the figure) etc.

Figure 10A:
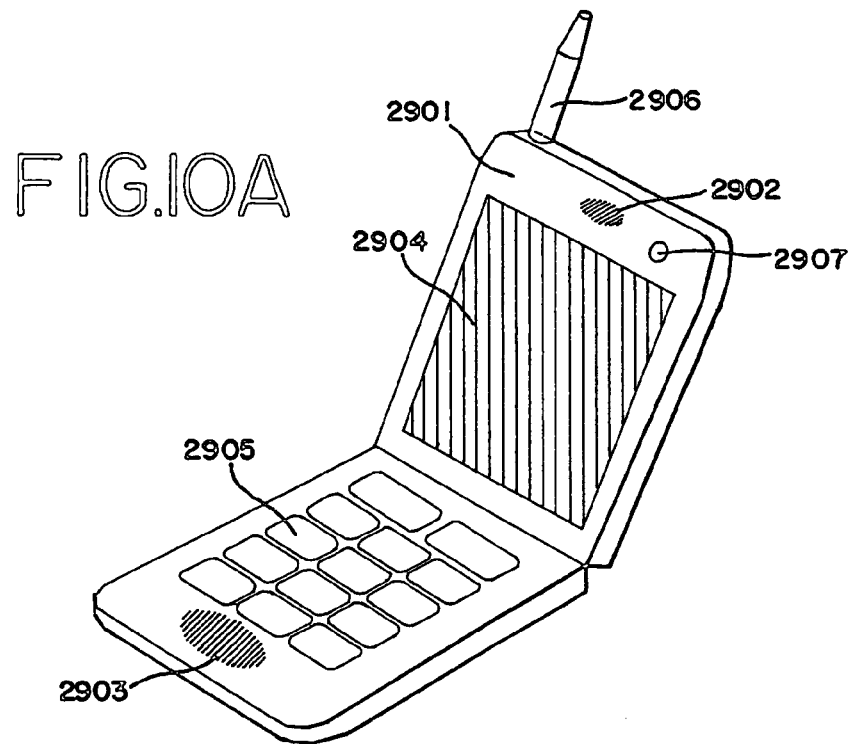
FIGS. 10A to 10C are drawings showing examples of electronic devices (Example 2)

FIG. 10A is a cellular phone which comprises: a main body 2901; voice output section 2902; voice input section 2903; display section 2904; operation switches 2905; an antenna 2906; and an image input section (such as a CCD and an image sensor) 2907 etc.

Figure 10B:
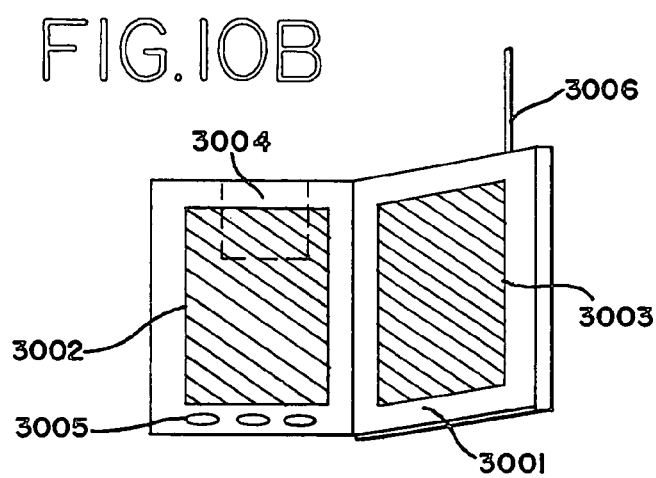

FIG. 10B is a portable book (an electronic book) which comprises: a main body 3001; display sections 3002 and 3003; a recording medium 3004; operation switches 3005; and an antenna 3006 etc.

Figure 10C:
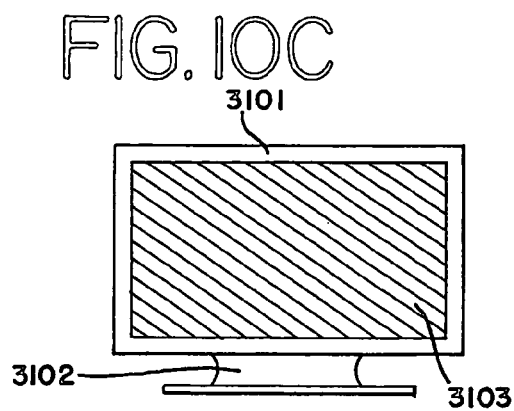
Figure 11A:
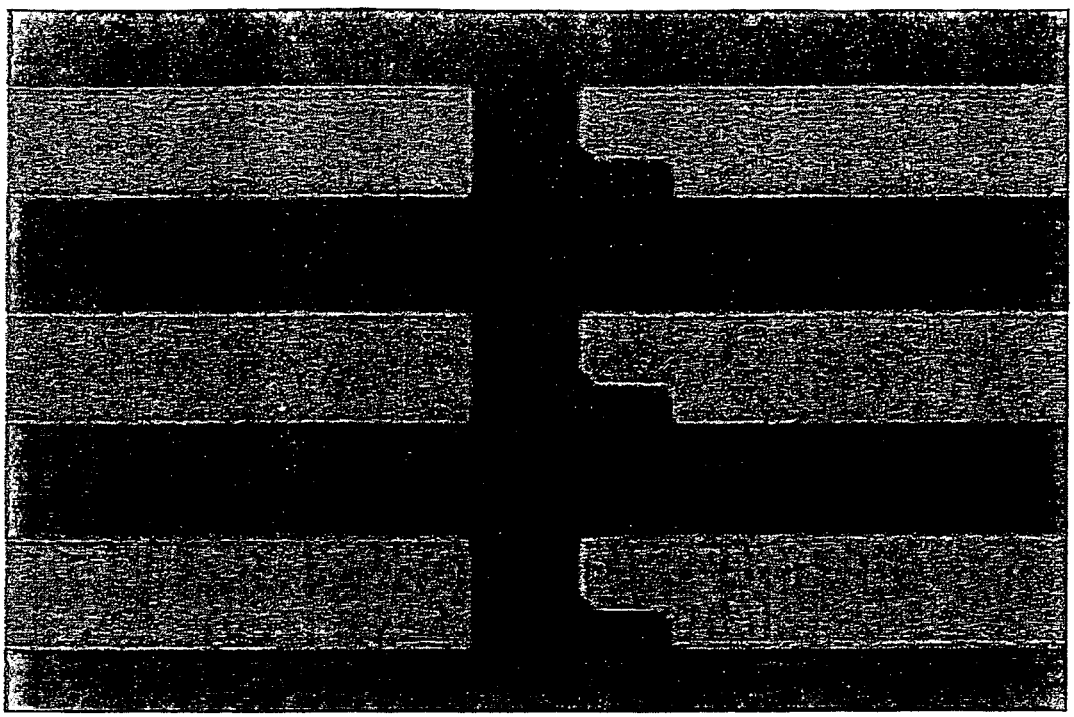
FIGS. 11A and 11B are photographs showing how a shrink expands along with the time passing.
Figure 11B:
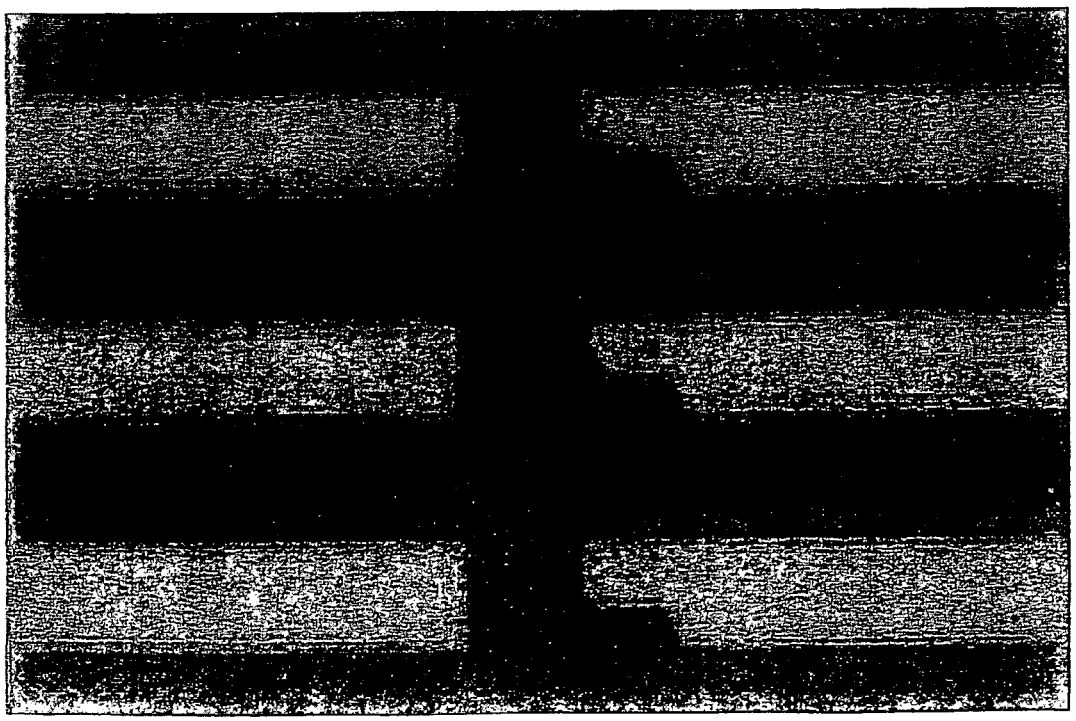
Figure 12A:
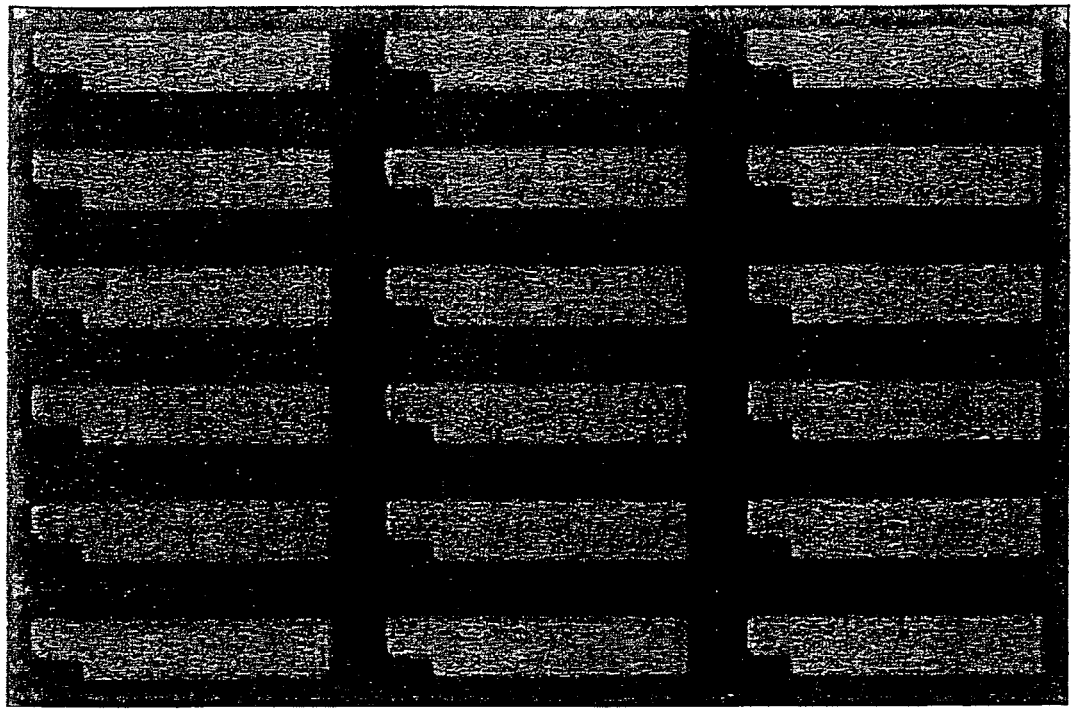
FIGS. 12A and 12B are photographs showing how a dark spot expands along with the time passing.
Figure 12B:
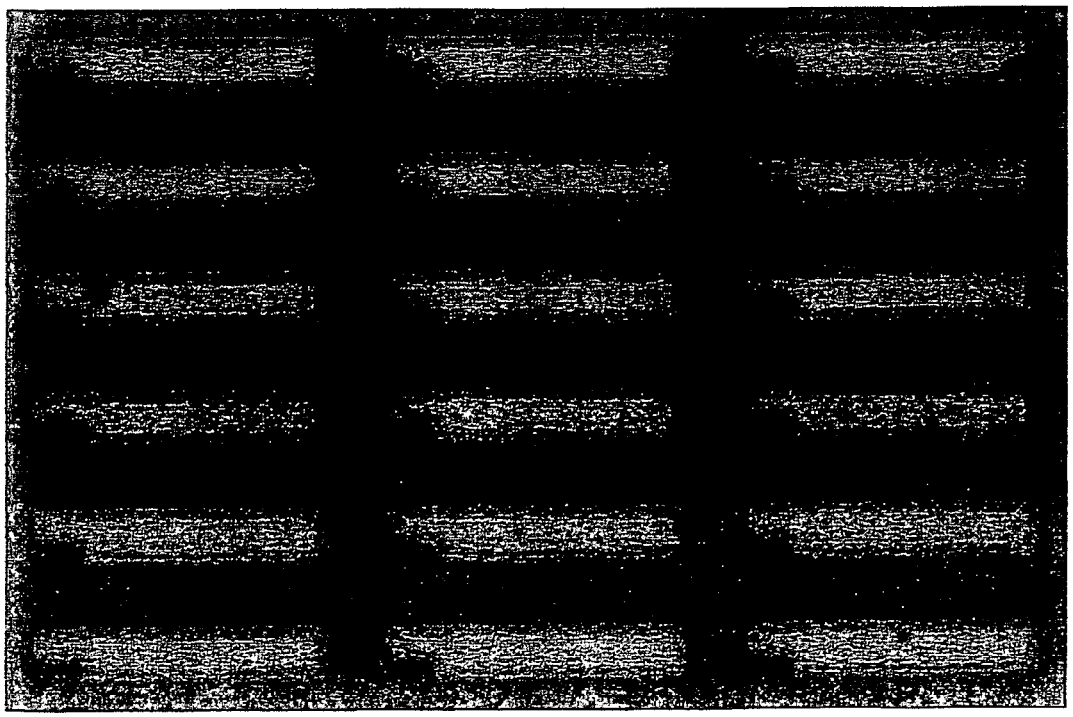
Figure 13:
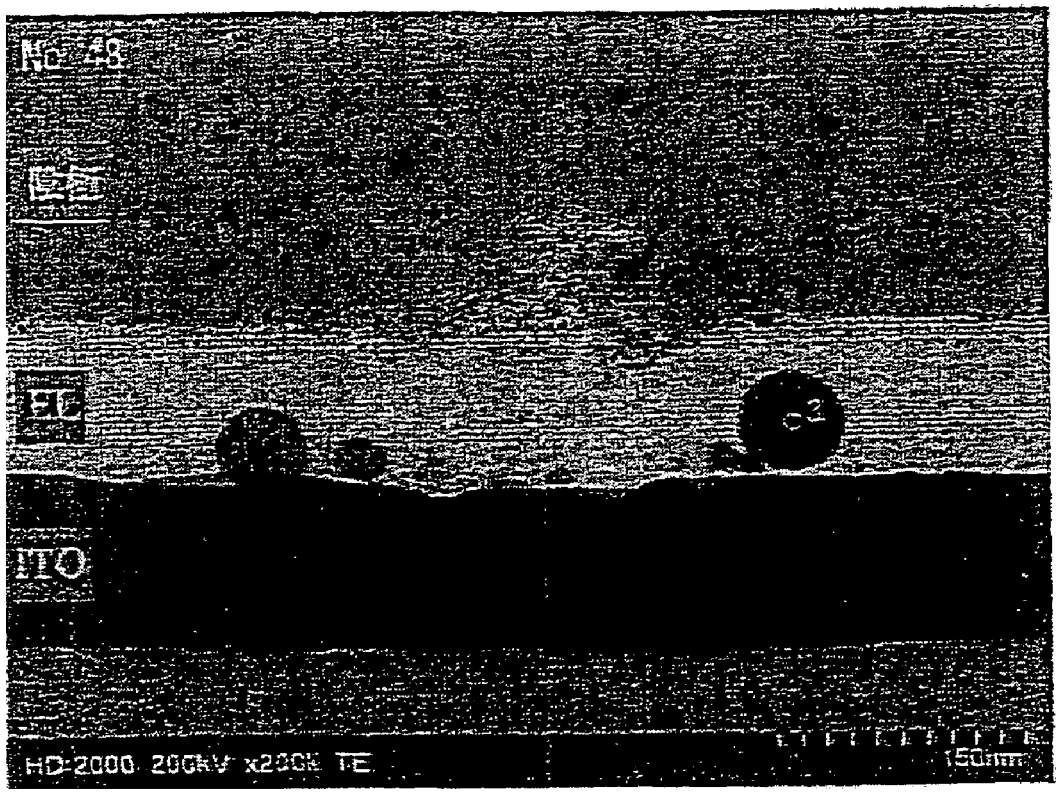
FIG. 13 is a cross-sectional TEM (Transmission Electron Microscopy) photograph of a portion that poorly emits the light.
Figure 14:
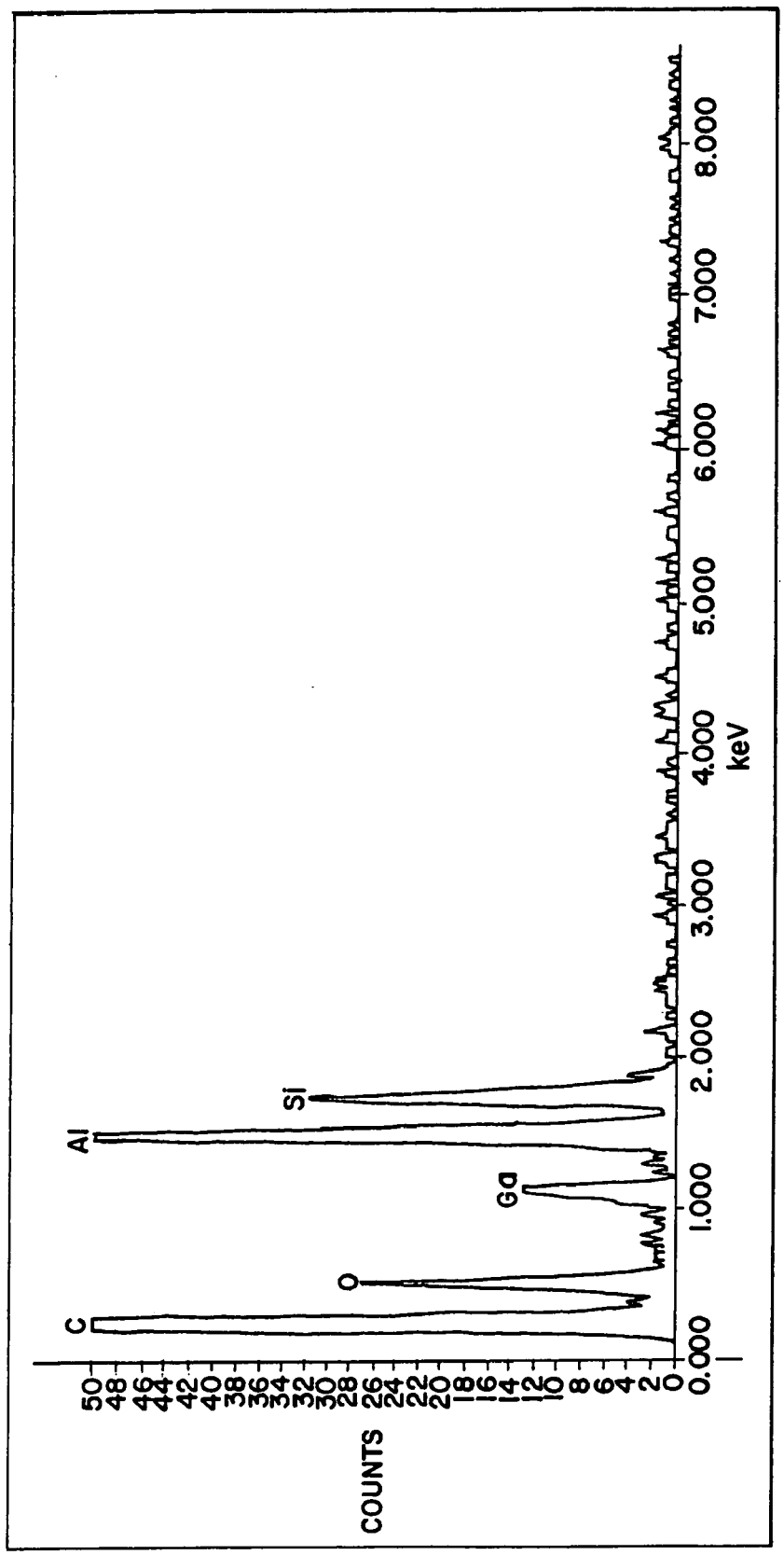
FIG. 14 shows the EDX (Energy Dispersive X-ray Fluorescence Spectrometer) measurement results of the portion that poorly emits the light (POINT 1)
Figure 15:
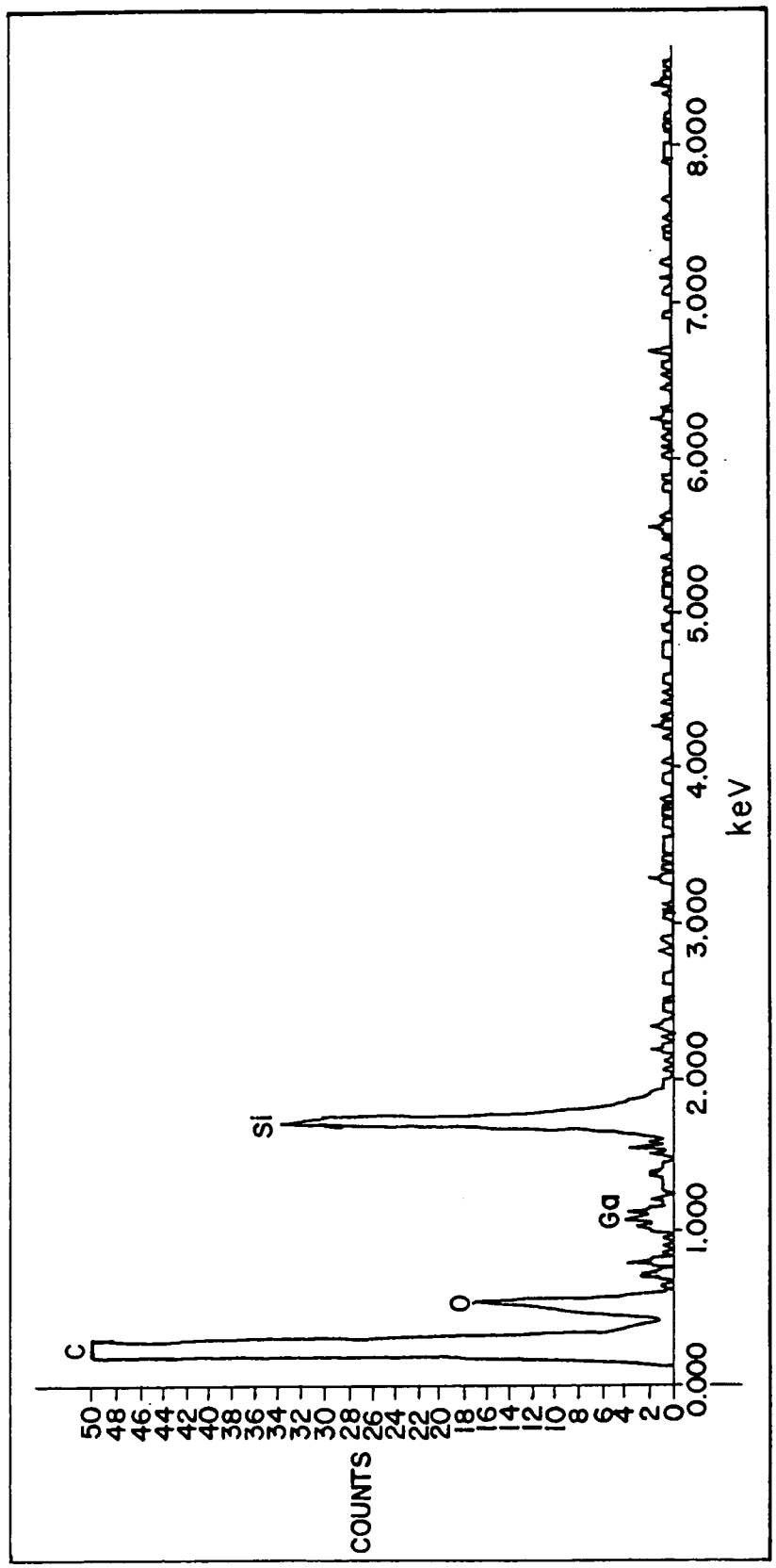
FIG. 15 shows the EDX (Energy Dispersive X-ray Fluorescence Spectrometer) measurement results of the portion that poorly emits the light (POINT 2)
Figure 16:
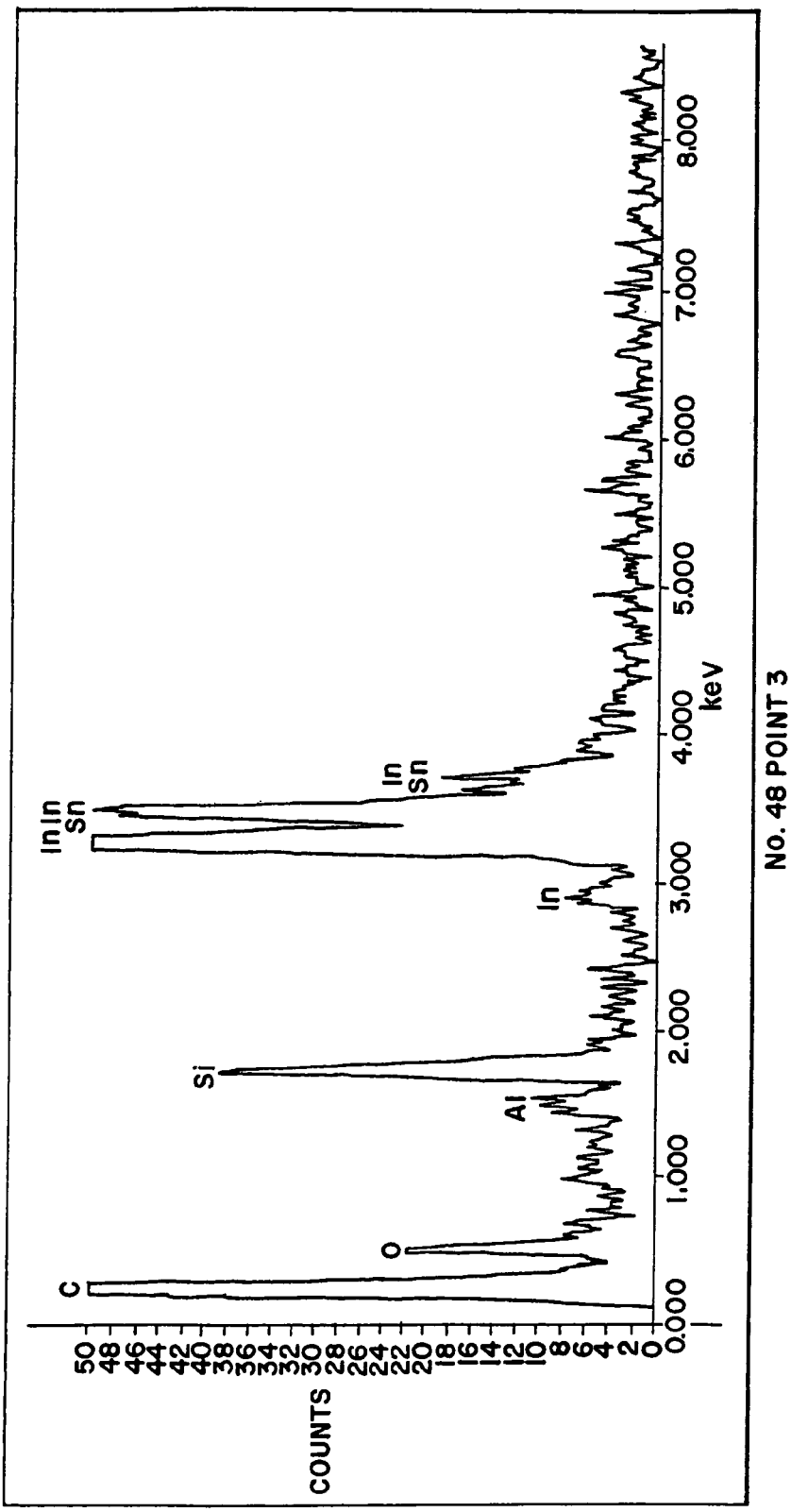
FIG. 16 shows the EDX (Energy Dispersive X-ray Fluorescence Spectrometer) measurement results of the portion that poorly emits the light (POINT 3).

FIG. 10C is a display which comprises: a main body 3101; a supporting base 3102; a display section 3103 etc.

In addition, the display shown in FIG. 10C has small and medium-sized or large-sized screen, for example a size of 5 to 20 inches. Further, to manufacture the display section with such sizes, it is preferable to mass-produce by executing a multiple pattern using a substrate sized 1×1 m.

As described above, the applicable range of the present invention is extremely large, and the invention can be applied to the electronic equipment of various areas. Further, the electronic devices of this example can be achieved by utilizing any combination of constitutions in Example 1.

According to the present invention, a light emitting device without dark spots and without point defects can be completed. Furthermore, a light emitting device having a high reliability without causing a shrink even in the case where the long time passes can be realized.

What is claimed is:

1. A method of fabricating a light emitting device, comprising the steps of:
    forming an anode;
    forming an insulating material comprising a photosensitive organic material for covering end portions of the anode;
    washing a surface of the anode with a porous sponge;
    performing a vacuum heating immediately before a layer containing an organic compound is formed;
    forming the layer containing the organic compound; and
    forming a cathode over the layer containing the organic compound.

2. A method according to claim 1, wherein temperature of the vacuum heating is in the range from 100° C. to 250° C.

3. A method according to claim 1, wherein said vacuum heating has a degree of vacuum of $1\times10^{-3}$ Pa to $1\times10^{-6}$ Pa.

4. A method of fabricating a light emitting device, comprising the steps of:
    forming an anode;
    forming an insulating material comprising a photosensitive organic material for covering end portions of the anode;
    washing a surface of the anode with a porous sponge;
    performing a heating in an inactive atmosphere;
    performing a vacuum heating immediately before a layer containing an organic compound is formed;
    forming the layer containing the organic compound; and
    forming a cathode over the layer containing the organic compound.

5. A method according to claim 4, wherein temperature of the vacuum heating is in the range from 100° C. to 250° C.

6. A method according to claim 4, wherein said vacuum heating has a degree of vacuum of $1\times10^{-3}$ Pa to $1\times10^{-6}$ Pa.

7. A method of fabricating a light emitting device, comprising the steps of:
    forming an anode;
    forming an insulating material comprising a photosensitive organic material for covering end portions of the anode;
    washing a surface of the anode with a porous sponge;
    irradiating the anode with an ultraviolet light;
    performing a vacuum heating immediately before a layer containing an organic compound is formed;
    forming the layer containing the organic compound; and
    forming a cathode the layer containing the organic compound.

8. A method according to claim 7, wherein temperature of the vacuum heating is in the range from 100° C. to 250° C.

9. A method according to claim 7, wherein said vacuum heating has a degree of vacuum of $1\times10^{-3}$ Pa to $1\times10^{-6}$ Pa.

10. A method of fabricating a light emitting device, comprising the steps of:
    forming a thin film transistor over a substrate;
    forming an insulating film over the thin film transistor;
    forming an anode electrically connected to the thin film transistor over the insulating film;

forming an insulating material comprising a photosensitive organic material for covering end portions of the anode;
washing a surface of the anode with a porous sponge;
performing a vacuum heating immediately before a layer containing an organic compound is formed;
forming the layer containing the organic compound; and
forming a cathode the layer containing the organic compound.

11. A method according to claim 10, wherein temperature of the vacuum heating is in the range from 100° C. to 250° C.

12. A method according to claim 10, wherein said vacuum heating has a degree of vacuum of $1\times10^{-3}$ Pa to $1\times10^{-6}$ Pa.

13. A method of fabricating a light emitting device, comprising the steps of:
forming a thin film transistor over a substrate;
forming an insulating film over the thin film transistor;
forming an anode electrically connected to the thin film transistor over the insulating film;
forming an insulating material comprising a photosensitive organic material for covering end portions of the anode;
washing a surface of the anode with a porous sponge;
performing a heating in an inactive atmosphere;
performing a vacuum heating immediately before a layer containing an organic compound is formed;
forming the layer containing the organic compound; and
forming a cathode the layer containing the organic compound.

14. A method according to claim 13, wherein temperature of the vacuum heating is in the range from 100° C. to 250° C.

15. A method according to claim 13, wherein said vacuum heating has a degree of vacuum of $1\times10^{-3}$ Pa to $1\times10^{-6}$ Pa.

16. A method of fabricating a light emitting device, comprising the steps of:
forming a thin film transistor over a substrate;
forming an insulating film over the thin film transistor;
forming an anode electrically connected to the thin film transistor over the insulating film;
forming an insulating material comprising a photosensitive organic material for covering end portions of the anode;
washing a surface of the anode with a porous sponge;
irradiating said anode with an ultraviolet light;
performing a vacuum heating immediately before a layer containing an organic compound is formed;
forming the layer containing the organic compound; and
forming a cathode.

17. A method according to claim 16, wherein temperature of the vacuum heating is in the range from 100° C. to 250° C.

18. A method according to claim 16, wherein said vacuum heating has a degree of vacuum of $1\times10^{-3}$ Pa to $1\times10^{-6}$ Pa.

* * * * *